(12) United States Patent
Gendron-Hansen et al.

(10) Patent No.: US 12,074,226 B2
(45) Date of Patent: Aug. 27, 2024

(54) SCHOTTKY DIODE INTEGRATED WITH A SEMICONDUCTOR DEVICE

(71) Applicants: Analog Power Conversion LLC, Bend, OR (US); Kyosan Electric Manufacturing Co., Ltd., Yokohama (JP)

(72) Inventors: Amaury Gendron-Hansen, Bend, OR (US); Dumitru Gheorge Sdrulla, Bend, OR (US); Leslie Louis Szepesi, Bend, OR (US); Tetsuya Takata, Yokohama (JP); Itsuo Yuzurihara, Yokohama (JP); Tomohiro Yoneyama, Yokohama (JP); Yu Hosoyamada, Yokohama (JP)

(73) Assignees: Analog Power Conversion LLC, Bend, OR (US); Kyosan Electric Manufacturing Co., Ltd., Yokohama (JP)

( * ) Notice: Subject to any disclaimer, the term of this patent is extended or adjusted under 35 U.S.C. 154(b) by 527 days.

(21) Appl. No.: 17/475,255

(22) Filed: Sep. 14, 2021

(65) Prior Publication Data
US 2023/0084411 A1   Mar. 16, 2023

(51) Int. Cl.
*H01L 29/872* (2006.01)
*H01L 27/06* (2006.01)
(Continued)

(52) U.S. Cl.
CPC ........ *H01L 29/872* (2013.01); *H01L 27/0629* (2013.01); *H01L 29/1608* (2013.01); *H01L 29/7827* (2013.01)

(58) Field of Classification Search
CPC ............ H01L 29/1608; H01L 29/7827; H01L 29/872; H01L 27/0629
(Continued)

(56) References Cited

U.S. PATENT DOCUMENTS 6,979,863 B2   12/2005   Ryu
9,246,016 B1   1/2016    Yen et al.
(Continued)

FOREIGN PATENT DOCUMENTS

KR   1020120084796 A   7/2012

OTHER PUBLICATIONS

International Search Report and Written Opinion for related PCT/US2022/043147, mailed Jan. 2, 2023.
(Continued)

*Primary Examiner* — Monica D Harrison

(57) ABSTRACT

A semiconductor device comprises a semiconductor die having a first region and a second region, wherein an operating temperature of the second region is lower than an operating temperature of the first region. A plurality of first tubs are respectively disposed in the first region, the second region, or both. The semiconductor device further comprises a power device comprising a plurality of power device cells, and a diode having a plurality of diode cells. The power devices cells are disposed within tubs or portions of tubs that are in the first region, and the diode cells are disposed within tubs or portions of tubs that are in the second region. The power device may comprise a vertical metal oxide semiconductor field effect transistor (MOSFET), and the diode may comprise a vertical Schottky barrier diode (SBD).

15 Claims, 11 Drawing Sheets

(51) Int. Cl.
  *H01L 29/16* (2006.01)
  *H01L 29/78* (2006.01)
(58) Field of Classification Search
  USPC .......................................................... 257/777
  See application file for complete search history.

(56) References Cited

U.S. PATENT DOCUMENTS

| | | | |
|---|---|---|---|
| 10,418,476 | B2 | 9/2019 | Yen et al. |
| 2013/0313570 | A1 | 11/2013 | Sdrulla et al. |
| 2016/0005853 | A1 | 1/2016 | Su et al. |
| 2016/0336403 | A1* | 11/2016 | Momota ................. H01L 24/49 |
| 2016/0351468 | A1 | 12/2016 | Liang |
| 2016/0365320 | A1 | 12/2016 | Takizawa |
| 2019/0067151 | A1 | 2/2019 | Chen et al. |
| 2021/0305422 | A1* | 9/2021 | Sheng ............... H01L 29/66068 |

OTHER PUBLICATIONS

Han, Zhonglin et al.; A Novel 4H—SiC Trench MOSFET Integrated With Mesa-Sidewall SBD; IEEE Transactions on Electron Devices; Jan. 2021; pp. 192-196, vol. 68, No. 1.

Hsu, Fu-Jen et al.; High Efficiency High Reliability SiC MOSFET with Monolithically Integrated Schottky Rectifier; Proceedings of the 29th International Symposium on Power Semiconductor Devices & ICs; pp. 45-48; Sapporo, JP.

Jiang, Huaping et al.; Silicon Carbide Split-Gate MOSFET with Merged Schottky Barrier Diode and Reduced Switching Loss; Proceedings of the 2016 28th International Symposium on Power Semiconductor Devices and ICs (ISPSD); Jun. 2016; pp. 59-62; Prague, Czech Republic.

Shenai, Krishna et al.; Monolithically Integrated Power MOSFET and Schottky Diode with Improved Reverse Recovery Characteristics; IEEE Transactions on Electron Devices; Apr. 1990; pp. 1167-1169; vol. 37, No. 4.

Sundaresan, Siddarth et al.; Static and Switching Characteristics of 1200 V SiC Junction Transistors with On-chip Integrated Schottky Rectifiers; Proceedings of the 26th International Symposium on Power Semiconductor Devies & ICs; Jun. 2014; pp. 249-252; Waikoloa, Hawaii.

Sung, Woongje et al.; Monolithically Integrated 4H—SiC MOSFET and JBS Diode (JBSFET) Using a Single Ohmic/Schottky Process Scheme; IEEE Electron Device Letters; Dec. 2016, pp. 1605-1608; vol. 37, No. 12.

Yen, Cheng-Tyng et al.; 1700V/30A 4H—SiC MOSFET with Low Cut-in Voltage Embedded Diode and Room Temperature Boron Implanted Termination; Proceedings of the 27th International Symposium on Power Semiconductor Devices & IC's; May 2015; pp. 265-268; Hong Kong.

Yen, Cheng-Tyng et al.; Avalanche Ruggedness and Reverse-Bias Reliability of SiC MOSFET with Integrated Junction Barrier Controlled Schottky Rectifier; Proceedings of the 30th International Symposium on Power Semiconductor Devices & IC's; May 2018; pp. 56-59; Chicago, US.

Yi, Bo et al.; SiC trench MOSFET with integrated side-wall Schottky barrier diode having P+ electric field shield; IEICE Electronics Express; Feb. 2019; pp. 1-10; vol. 16, No. 5.

* cited by examiner

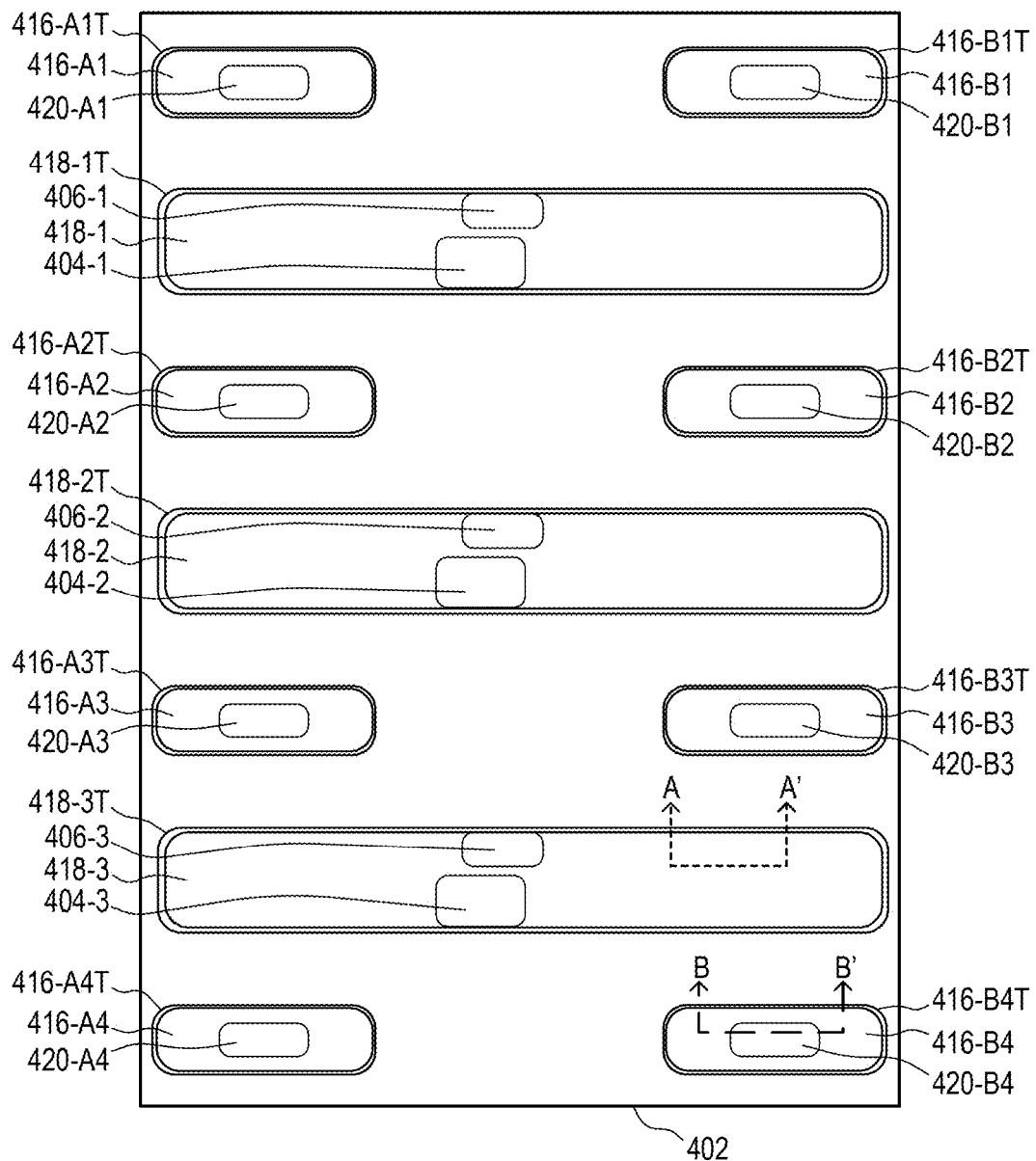
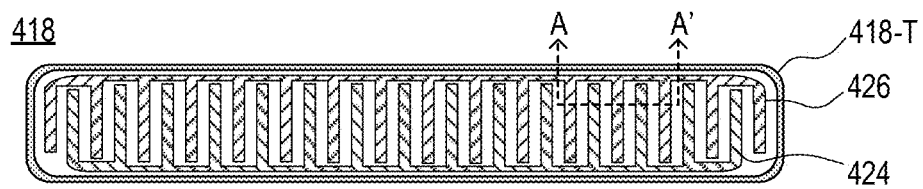

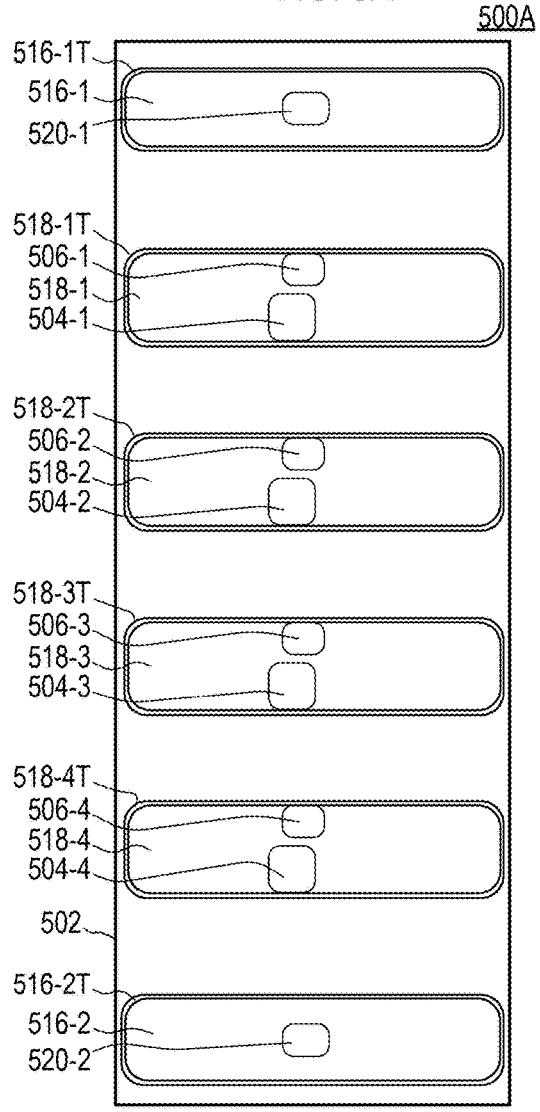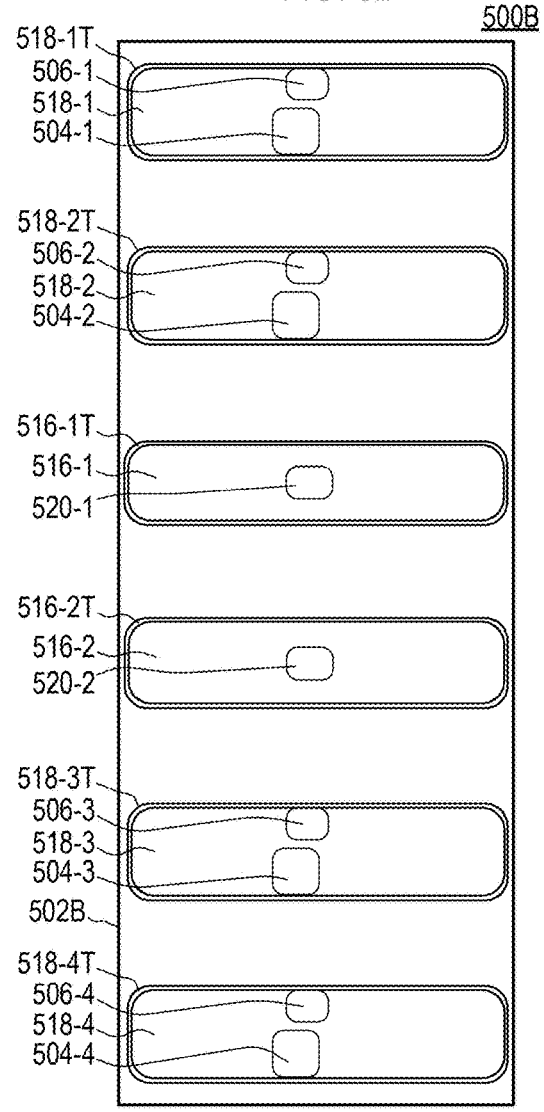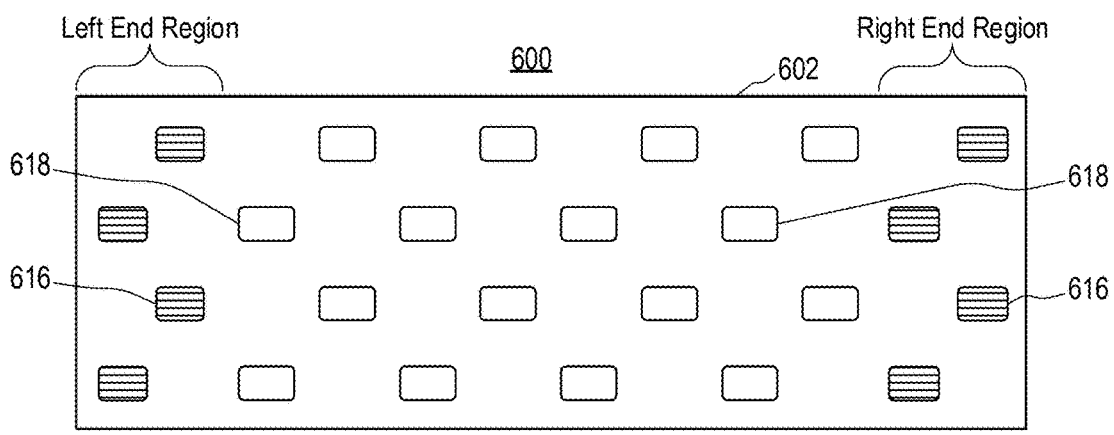

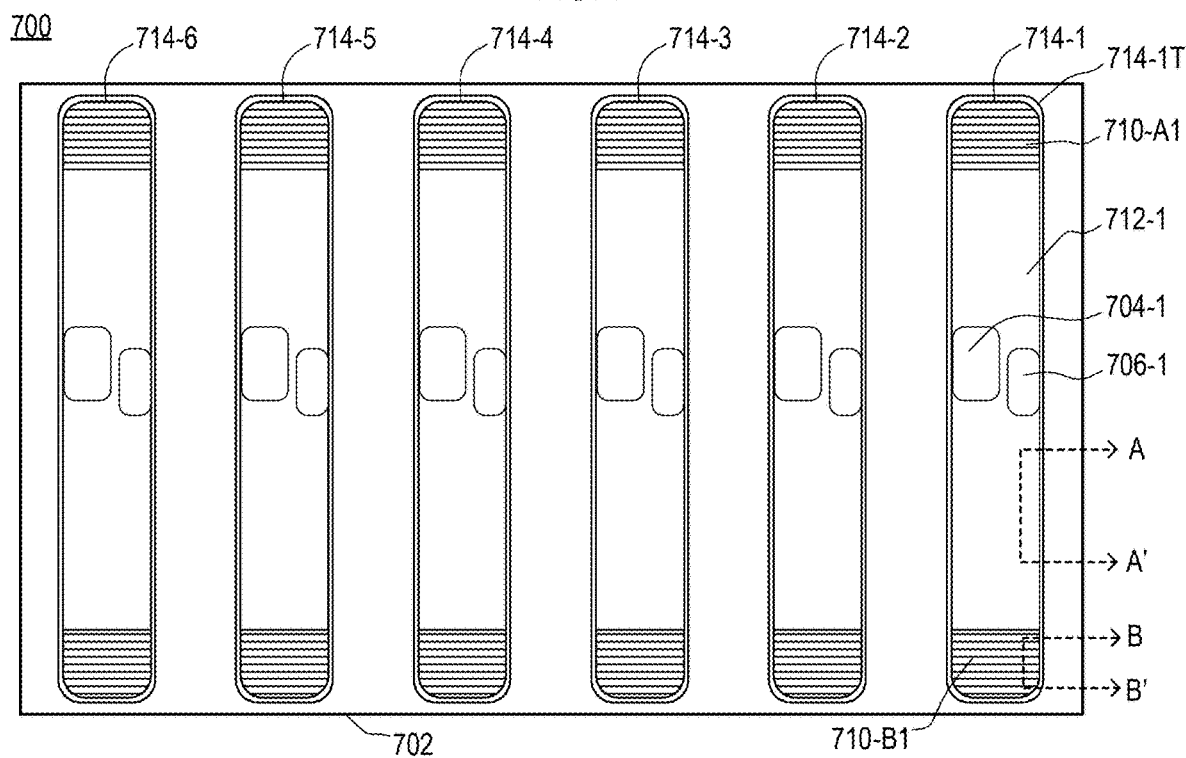
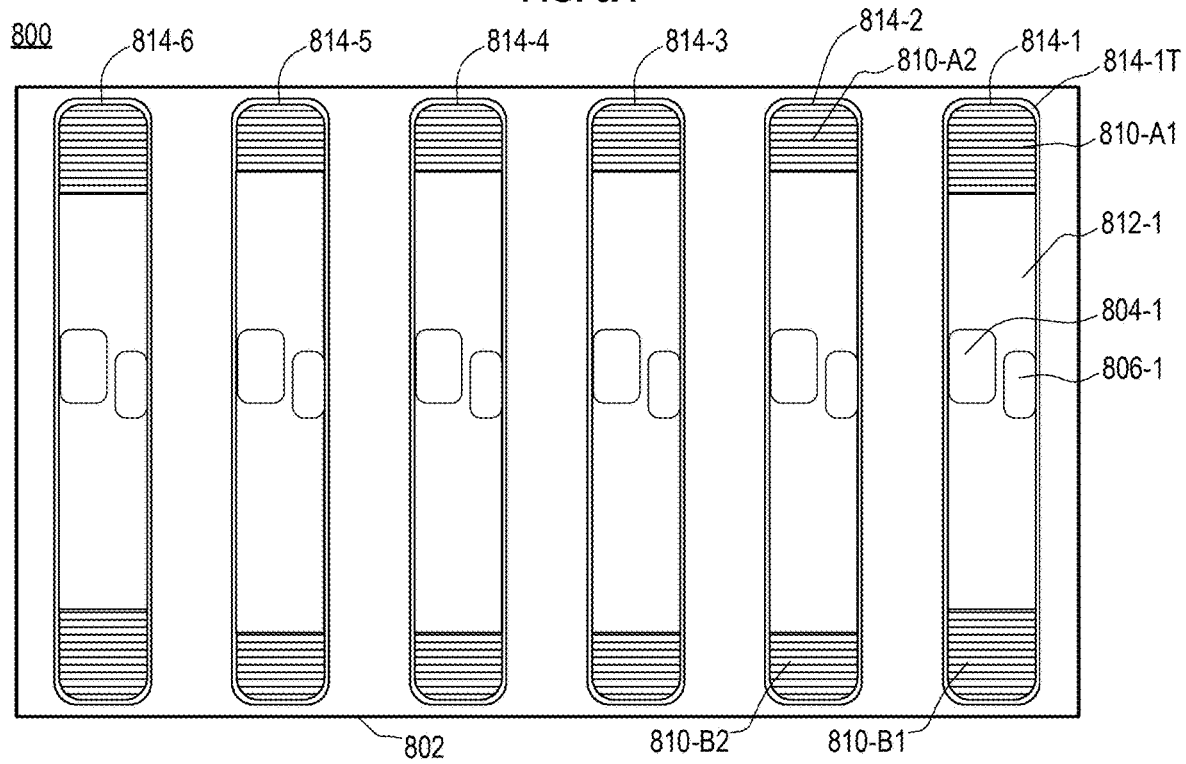

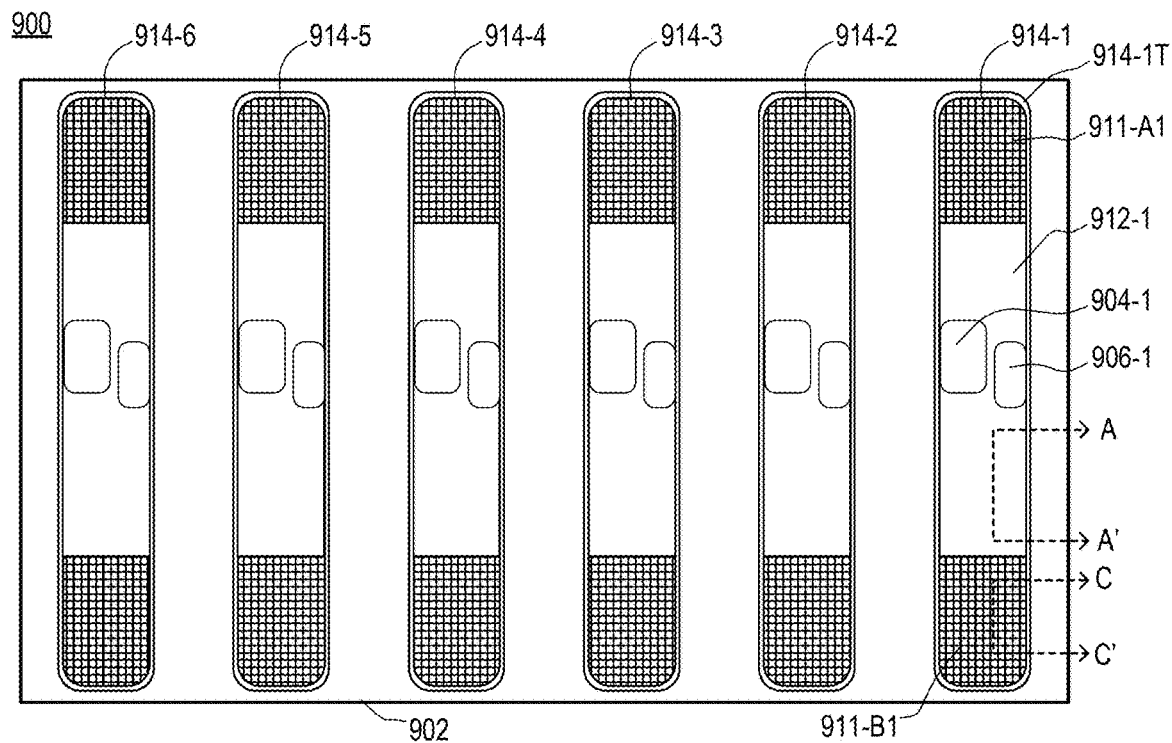
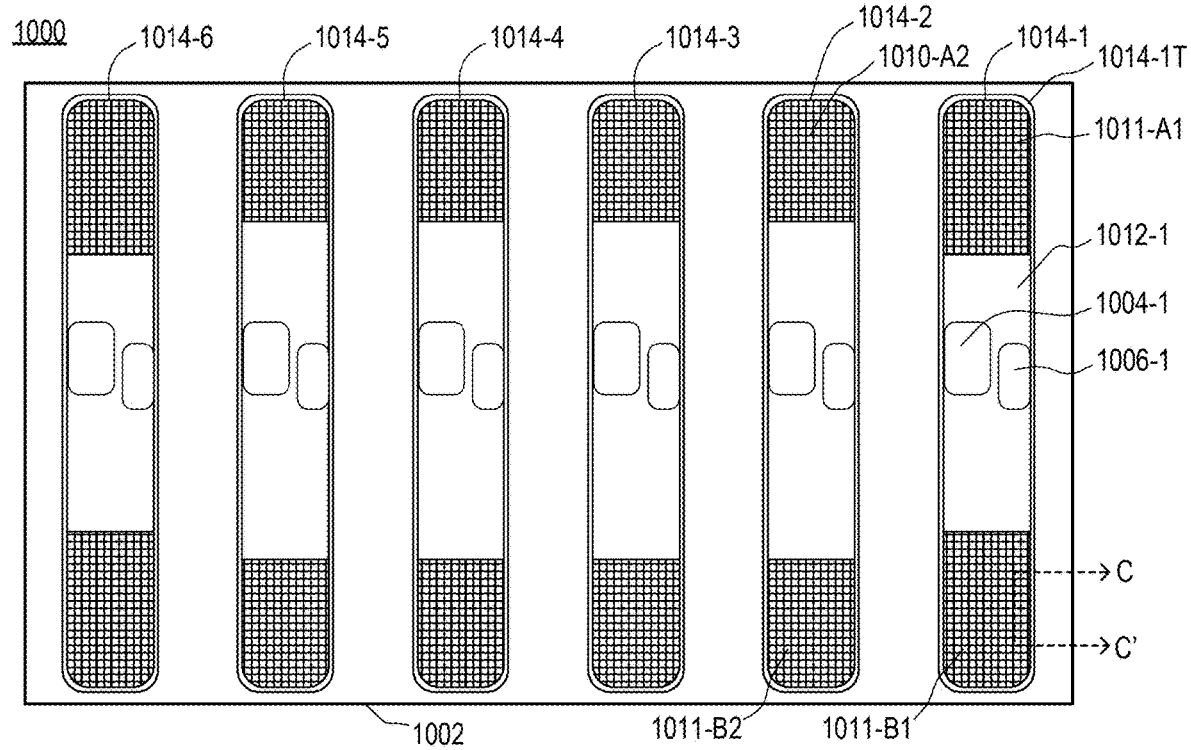

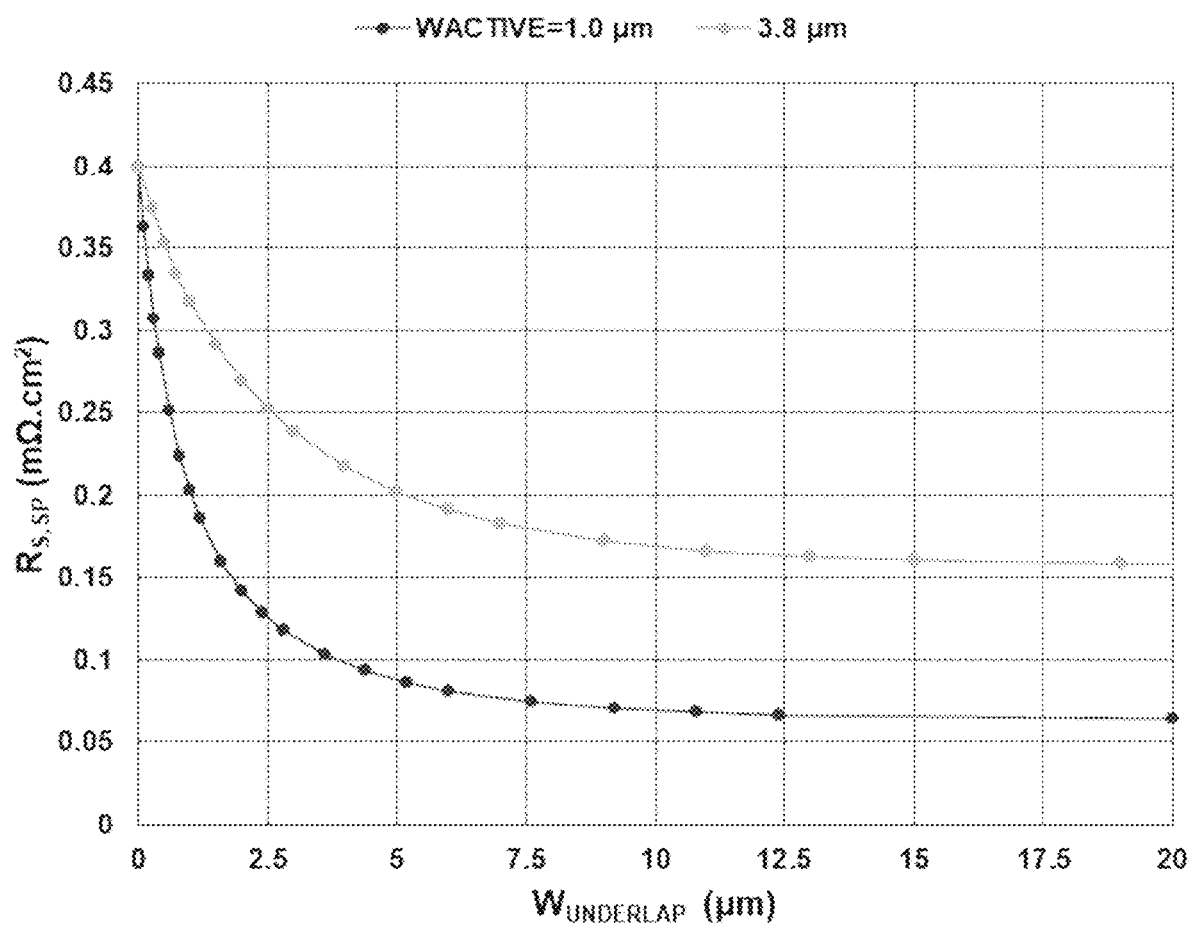

SCHOTTKY DIODE INTEGRATED WITH A SEMICONDUCTOR DEVICE

BACKGROUND

Schottky Barrier Diodes (SBDs) have no reverse recovery charges and are widely used as Free-Wheeling Diodes (FWD) in parallel with power devices to improve the efficiency of power conversion modules (including modules with half-bridge and full-bridge topologies). The power device may be, for example, a Metal-Oxide-Semiconductor Field Effect Transistor (MOSFET), an Insulated Gate Bipolar Transistor (IGBT), or a Junction FET (JFET).

Silicon carbide (SiC) SBDs have an extremely low capacitive charge, and hence are ideal as FWDs in switching applications. Furthermore, body diodes of SiC MOSFETs are prone to bipolar degradation due to the expansion of the crystal defects from the substrate, and as a result are not good candidates for FWDs. Therefore, SiC MOSFETs power devices in switching applications are often paired with SiC SBDs.

For Radio Frequency (RF) applications, the SBD is integrated on the same die as the power device to reduce the parasitic inductances. However, the operation of a power device may generate a substantial amount of heat, increasing the temperature of the die. An increase in temperature is highly detrimental to the operation of an SBD. For example, an increase in temperature causes an increase in the specific series resistance of the SBD, which requires the active area footprint to be increased and results in a higher junction capacitance of the SBD.

It would be beneficial to have a device comprising a power device and an integrated SBD wherein the increase in the temperature of the SBD caused by the operation of the power device is reduced.

SUMMARY OF THE INVENTION

Embodiments relate to semiconductor devices, and in particular to a semiconductor device including a power device and Schottky Barrier Diode (SBD), wherein the semiconductor device has compact active regions (hereinafter, "tubs") spaced apart from each other, and the power device and the SBD are implemented within the tubs. In embodiments, the semiconductor device is a wide-bandgap power semiconductor device designed to operate at radio frequencies. Embodiments are configured to reduce the impact of heat generated by the power device on the SBD.

In an embodiment, a semiconductor device comprises a semiconductor die having a first region and a second region, wherein an operating temperature of the second region is lower than an operating temperature of the first region. A plurality of first tubs are disposed in the first region, and a plurality of second tubs are disposed in the second region. The semiconductor device further comprises a power device comprising a plurality of power device cells, the power device cells being respectively disposed in the plurality of first tubs, and a diode having a plurality of diode cells, the plurality of diode cells being respectively disposed in the plurality of second tubs.

In another embodiment, a semiconductor device comprises a semiconductor die consisting of a first region and a second region, wherein an operating temperature of the second region is lower than an operating temperature of the first region. A first tub is disposed in both the first region and the second region, the first tub including a first power device cell of a power device disposed in the first region, and a first plurality of diode cells of a diode, wherein all the diode cells of the first tub are disposed within the second region.

BRIEF DESCRIPTION OF THE DRAWINGS

FIG. 4A illustrates a multi-tub semiconductor device including a Vertical MOSFET and an SBD according to an embodiment.

FIG. 4B illustrates a detail of a Vertical MOSFET tub of the semiconductor device of FIG. 4A according to an embodiment.

FIGS. 5A and 5B illustrates multi-tub semiconductor devices including a Vertical MOSFET and an SBD according to other embodiments.

FIG. 6 illustrates a multi-tub semiconductor device including a Vertical MOSFET and an SBD according to another embodiment.

FIG. 7 illustrates a multi-tub semiconductor device including a Vertical MOSFET and an SBD according to another embodiment.

FIGS. 8A, 8B, and 8C respectively illustrate multi-tub semiconductor devices including Vertical MOSFETs and SBDs according to other embodiments.

FIG. 9 illustrates a multi-tub semiconductor device including a Vertical MOSFET and an SBD according to another embodiment.

FIG. 10 illustrates a multi-tub semiconductor device including a Vertical MOSFET and an SBD according to another embodiment.

FIG. 13 illustrates an effect of current spreading on an SBD cell of a semiconductor device according to an embodiment.

DETAILED DESCRIPTION

Embodiments of the present application relate to sparse layouts of tubs containing cells of a semiconductor power device, and in particular to sparse layouts of tubs containing cells of a power device such as a silicon carbide (SiC) Vertical Metal-Oxide-Semiconductor Field Effect Transistor (VMOSFET) or a SiC Vertical Insulated Gate Bipolar Transistor (V-IGBT) along with tubs containing cells of a Schottky Barrier Diode (SBD).

Although embodiments presented herein may be described with respect to SiC technology, embodiments are not limited thereto, and in other embodiments, a normal bandgap semiconductors, another wide bandgap (WBG) semiconductor, or an ultra-wide bandgap (UWGB) semiconductor may be used instead, such as silicon, gallium arsenide (GaAs), gallium nitride (GaN), aluminum gallium nitride (AlGaN), high aluminum content AlGaN, beta gallium trioxide ($\beta$-$Ga_2O_3$), diamond, boron nitrides, and the like. Other embodiments may use a polytype of SiC other than 4H, such as 3C—SiC or 6H—SiC.

A detailed description of embodiments is provided below along with accompanying figures. The scope of this disclosure is limited only by the claims and encompasses numerous alternatives, modifications, and equivalents. Although steps of various processes may be presented in a given order, embodiments are not necessarily limited to being performed in the listed order. In some embodiments, certain operations may be performed simultaneously, performed in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
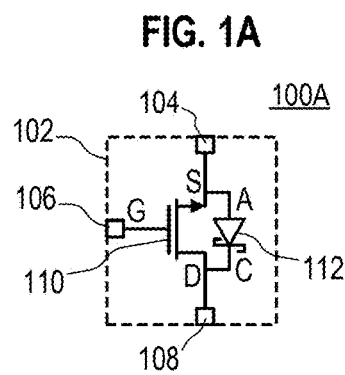
FIG. 1A is a schematic of a semiconductor device including a power device and an integrated SBD according to an embodiment.

FIG. 1A is a schematic of a semiconductor device 100A including a power device—here, an n-channel MOSFET 110—and an integrated SBD 112 according to an embodiment. The SBD 112 is connected anti-parallel to the MOSFET 110.

A source of the MOSFET 110 and an anode of the SBD 112 are connected to a source contact 104. A gate of the VMOSFET 110 is connected to a gate contact 106. A drain of the MOSFET 110 and a cathode of the SBD 112 are connected to a drain contact 108.

Embodiments herein may be described wherein the power device is an n-channel VMOSFET, and in particular a SiC n-channel MOSFET, but embodiments are not limited thereto. For example, in embodiments the power device may instead include a planar MOSFET, a planar or Vertical IGBT, a Junction FET (JFET), a p-channel device, a bipolar junction transistor (BJT), a thyristor, a gate turn-off thyristor (GTO), or the like.

Elements of a semiconductor device may be composed of a plurality of cells. For example, an SBD may include a plurality of cells, each cell including its own anode and its own cathode. In a Vertical SBD, the cathodes of each cell may all be connected to a contact pad disposed over a surface of the die opposite the surface over which the contact pads connected to the anodes are disposed.

Similarly, a Vertical MOSFET (VMOSFET) may include a plurality of cells, each cell including its own gate conductor and associated gate pad, source region and associated source pad, and a drain. The drains of the cells may all be connected to a contact pad disposed over a surface of the die opposite the surface over which the gate and source pads are disposed.

The plurality of cells of a semiconductor device may be disposed with a plurality of tubs on a semiconductor die, with each tub including one or more of the cells. A semiconductor device including a plurality of tubs may be referred to herein as a multi-tub semiconductor device.

The tubs correspond to active regions of the semiconductor device, and regions outside the tubs may be deemed inactive regions. As used herein, active and inactive regions are generally differentiated by the generation of heat. Accordingly, the tubs of a semiconductor device may be defined as the regions near the surface or in specific volumes in which substantial power is dissipated under normal conditions of operation. The specific volumes may extend throughout the entire thickness of the die but not across the entire surface of a die. The tubs therefore appear on a thermal scan (as with an infrared camera) as regions with higher temperature than their surroundings during normal operation of the device, and temperatures above ambient in the inactive regions usually result only because of diffusion of heat out of the tubs into the inactive regions.

The tubs may also be defined as the regions (volumes) of the die which performs the function required (designed) for a specific application of the semiconductor device. As a non-limiting example, the function of a power semiconductor may be to control a current by switching between off (no electric current conduction) and on (substantial electric current conduction) states, and the tubs of that power semiconductor would be the regions that perform that switching.

In some devices, such as high-voltage power semiconductor devices, the tubs may be bounded by high-voltage termination structures. In such a device, the tubs would be those regions disposed within respective high-voltage termination structures, and the inactive regions would be those regions of the device not within a respective high-voltage termination structures.

Furthermore, as the functionality of most semiconductors devices is determined by, among other things, the doping of the semiconductor, the tubs of a semiconductor device will have highly-doped regions of various polarities inside them (typically with dopant concentrations of $1.0E17$ $cm^{-3}$ or higher for SiC technology), while the inactive regions include only low-doped epitaxy (typically with dopant concentrations of $2.0E16$ $cm^{-3}$ and lower for SiC technology) and/or dielectric regions. In some devices, the inactive regions may leave the starting material in its original state, with no additional doping. For example, when the semiconductor device is formed by growing a lightly doped n-type semiconductor to form an epitaxy on a substrate comprising a heavily doped n-type semiconductor, the portions of the epitaxy and substrate in the inactive regions of the completed device may have the dopant concentration present when the formation of the epitaxy was complete.

Respective control pads (for example, gate pads) may be provided for each tub. In embodiments, one or more pads for a conduction terminal of a first type (for example, one or more source pads) may be provided for each tub. Conduction terminals of a second type (for example, a drain) may be electrically coupled together to a single pad, such as a drain pad. When the device is a vertical device, the pads for the control terminals and for the conduction terminals of the first type may be formed over one face (e.g., the top) of the die, and the pad for the conduction terminals of the second type may be formed over an opposite face (e.g. the bottom) of the die.

When tubs are spaced substantially apart, a more uniform temperature over a surface of the die used to dissipate heat may be obtained, which may improve the ability of the die to dissipate heat. Also, spacing the tubs apart may improve a specific series resistance of a vertical device by spreading the current passing through the device in a substrate of the device.

Figure 1B:
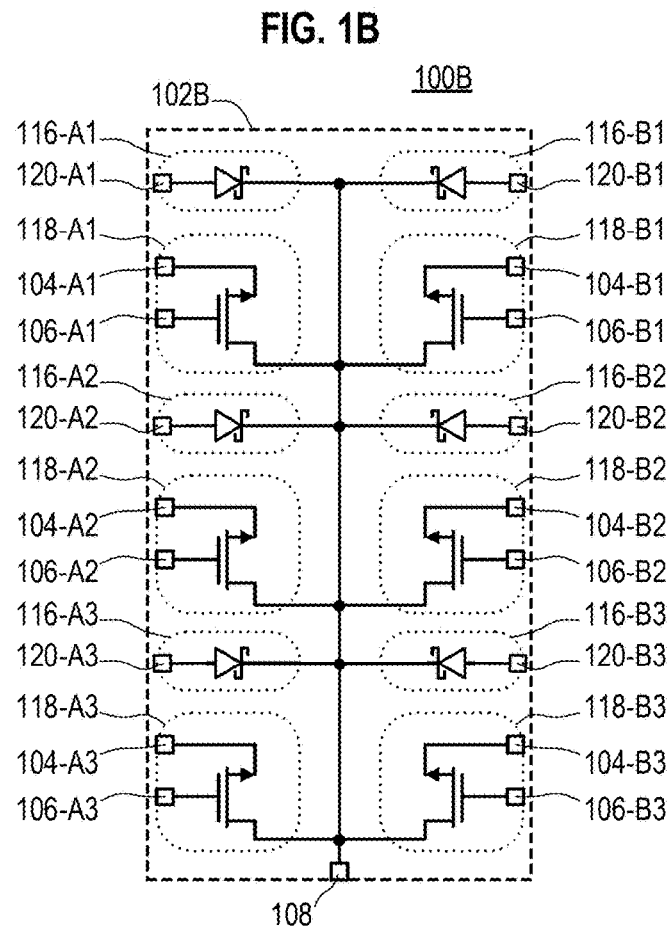
FIG. 1B illustrates a semiconductor device including a power device and an integrated SBD according to an embodiment.

FIG. 1B is a schematic of a multi-tub semiconductor device 100B including a power device and an integrated SBD according to an embodiment. In FIG. 1B, the power device may be a Vertical MOSFET, and the SBD may be a Vertical SBD.

The semiconductor device 100B includes a plurality of SBD tubs 116-A1, 116-A2, 116-A3, 116-B1, 116-B2, and 116-B3 each comprising one or more cells of the SBD (hereinafter, SBD cells). A plurality of anode contacts 120-A1, 120-A2, 120-A3, 120-B1, 120-B2, and 120-B3 are respectively connected to the plurality of SBD tubs 116-A1, 116-A2, 116-A3, 116-B1, 116-B2, and 116-B3, each anode contact being connected to anodes of the SBD cells of the respective SBD tub. Cathodes of the SBD cells of each of the SBD tubs 116-A1, 116-A2, 116-A3, 116-B1, 116-B2, and 116-B3 are commonly connected to a drain contact 108.

The semiconductor device 100B further includes a plurality of MOSFET tubs 118-A1, 118-A2, 118-A3, 118-B1, 118-B2, and 118-B3 each comprising one or more cells of the MOSFET (hereinafter, MOSFET cells). A plurality of gate contacts 106-A1, 106-A2, 106-A3, 106-B1, 106-B2, and 106-B3 are respectively connected to the MOSFET tubs 118-A1, 118-A2, 118-A3, 118-B1, 118-B2, and 118-B3, each gate contact being connected to gates of the MOSFET cells of the respective MOSFET tub. A plurality of source contacts 104-A1, 104-A2, 104-A3, 104-B1, 104-B2, and 104-B3 are respectively connected to the MOSFET tubs 118-A1, 118-A2, 118-A3, 118-B1, 118-B2, and 118-B3, each source contact being connected to sources of the MOSFET cells of the respective MOSFET tub. Drains of the MOSFET cells of each of the MOSFET tubs 118-A1, 118-A2, 118-A3, 118-B1, 118-B2, and 118-B3 are commonly connected to the drain contact 108.

Figure 1C:
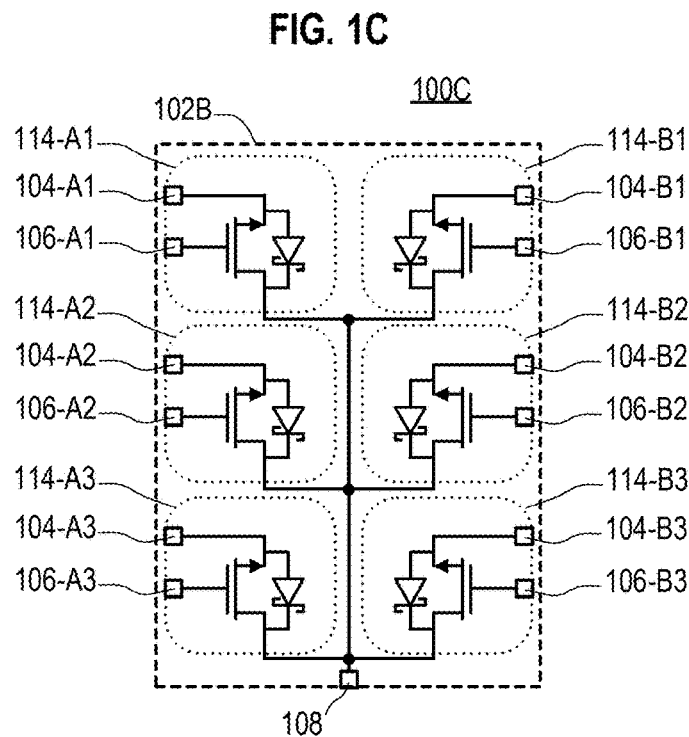
FIG. 1C illustrates a semiconductor device including a power device and an integrated SBD according to another embodiment.

FIG. 1C is a schematic of a multi-tub semiconductor device 100C including a power device and an integrated SBD according to an embodiment. In FIG. 1C, the power device may be a Vertical MOSFET, and the SBD may be a Vertical SBD.

The semiconductor device 100C includes a plurality of integrated tubs 114-A1, 114-A2, 114-A3, 114-B1, 114-B2, and 114-B3, each comprising one or more SBD cells and one or more MOSFET cells. A plurality of source contacts 104-A1, 104-A2, 104-A3, 104-B1, 104-B2, and 104-B3 are respectively connected to the integrated tubs 114-A1, 114-A2, 114-A3, 114-B1, 114-B2, and 114-B3, each source contact being connected to the anodes of the SBD cells and sources of the MOSFET cells of the respective integrated tub. A plurality of gate contacts 106-A1, 106-A2, 106-A3, 106-B1, 106-B2, and 106-B3 are respectively connected to the integrated tubs 114-A1, 114-A2, 114-A3, 114-B1, 114-B2, and 114-B3, each gate contact being connected to gates of the MOSFET cells of the respective integrated tub. Cathodes of the SBD cells and drains of the MOSFET cells of each of the integrated tubs 114-A1, 114-A2, 114-A3, 114-B1, 114-B2, and 114-B3 are commonly connected to a drain contact 108.

Embodiments form a semiconductor power device by forming a plurality of cells of the power device in a plurality of separated tubs. In particular, embodiments include semiconductor power device including a power device and an integrated diode, wherein each tub includes cells of the power device, cells of the diode, or both. In embodiments, the power device, the diode, or both may be vertical devices. In embodiments, the SBD cells are distributed among the tubs so as to reduce the operating temperature of the SBD cells.

Figure 2:
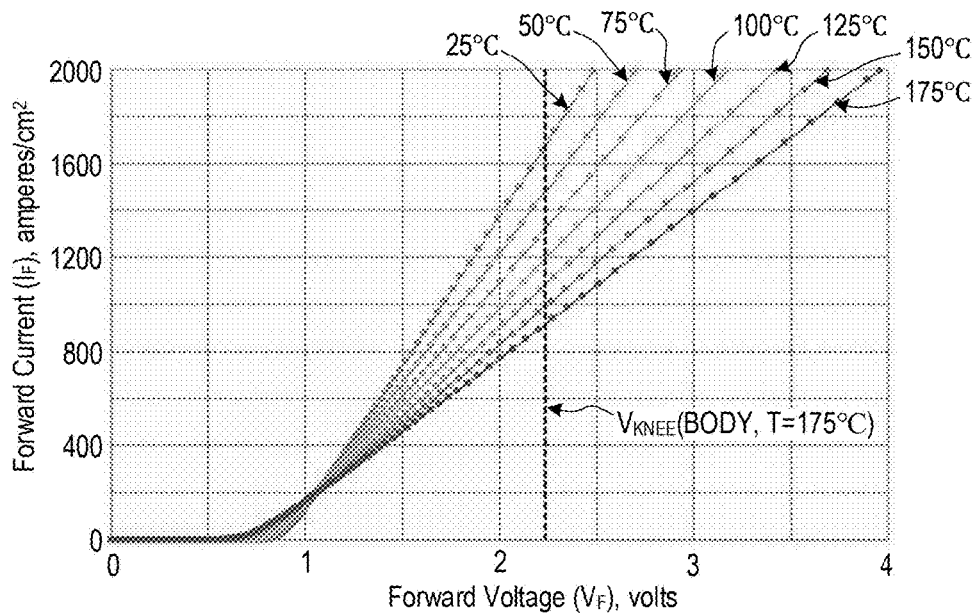
FIG. 2 illustrates forward conduction characteristics of an SBD at different temperatures.

FIG. 2 illustrates forward conduction characteristics of a SiC Vertical SBD at different temperatures. The X axis corresponds to a forward voltage drop $V_F$ across the diode, and the Y axis corresponds to a forward current density $I_F$ across the area of the SBD in amperes per $cm^2$. The relationship between the forward current density $I_F$ and forward voltage $V_F$ is shown for seven temperatures: 25° C., 50° C., 75° C., 100° C., 125° C., 150° C., and 175° C.

As shown in the diagram, because the SBD is a majority carrier device, once the current density rises above a relatively low value (about 200A per $cm^2$), the forward voltage $V_F$ for any particular forward current density $I_F$ increases rapidly with temperature. For example, at a forward current density $I_F$ of 1400 $A/cm^2$, the forward voltage $V_F$ increases from around 2.0 V at 25° C. to almost 3.0 V at 175° C.

If the requirements on the SBD limit the forward voltage drop $V_F$ at the rated forward current, then operating the SBD at a lower temperature allows the SBD to operate at a higher forward current density $I_F$ while still meeting the requirement for the forward voltage $V_F$. This allows the area of the die occupied by the SBD to be smaller.

Furthermore, the chart demonstrates that lowering the temperature of the SBD will decrease the power dissipated by the SBD when conducting high forward currents by reducing the forward voltage $V_F$.

Figure 3A:
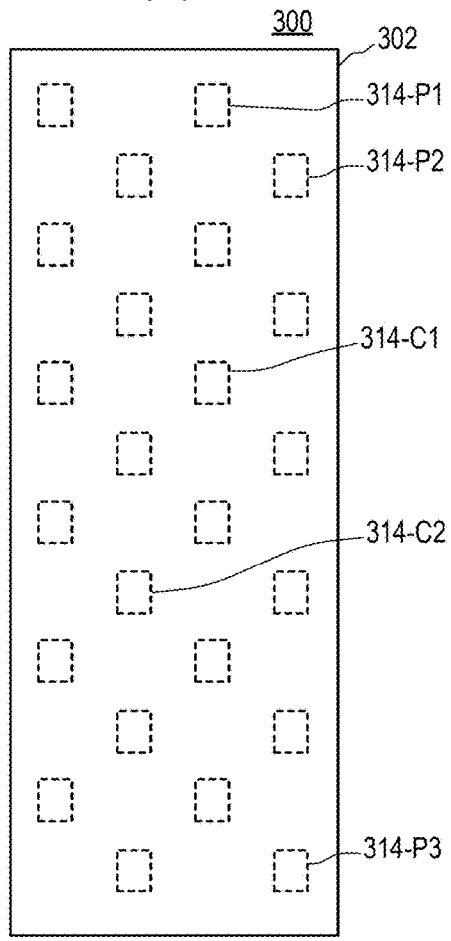
FIG. 3A illustrates a multi-tub semiconductor device having a plurality of tubs.
Figure 3B:
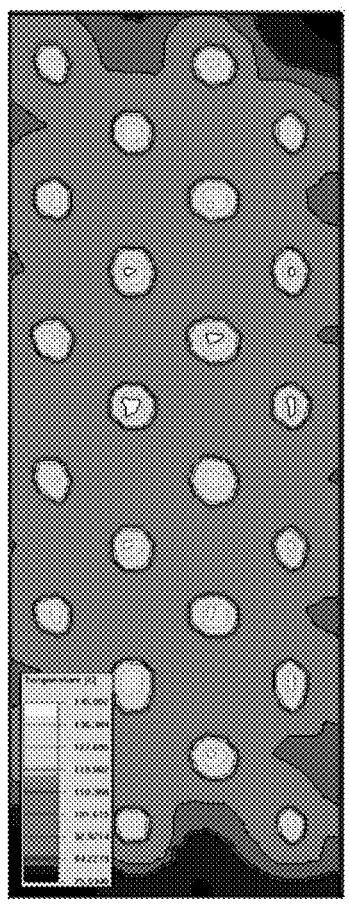
FIGS. 3B and 3C illustrates operating temperatures on a top and a bottom surface, respectively, of the semiconductor device of FIG. 3A.
Figure 3C:
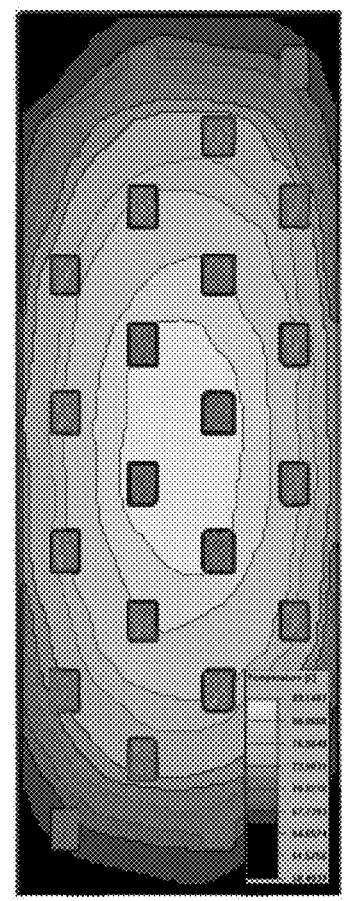

FIG. 3A illustrates a semiconductor device 300 having a plurality of tubs. FIGS. 3B and 3C illustrates operating temperatures on a top and a bottom surface, respectively, of the semiconductor device 300 of FIG. 3A.

The semiconductor device 300 includes a plurality of tubs, collectively referred to as tubs 314, disposed on a semiconductor die 302. The semiconductor die 302 may comprise SiC, but embodiments are not limited thereto.

The tubs 314 may each include active devices that may dissipate heat when in operation. The heat-generating portions of the active devices are mainly disposed near a top surface of the semiconductor die 302.

As shown in FIG. 3B, the temperature rise on the top surface occurs primarily in the tubs, since that is where the heat is mainly being generated. As shown in FIG. 3C, the heat spreads as it flows from the top to the bottom of the die, so that on the bottom of the die, the temperature near the center of the semiconductor die 302 is higher than the temperature near the edges.

Accordingly, operating temperatures in tubs 314-C1 and 314-C2 near the center of the semiconductor die 302 are higher than operating temperatures in tubs 314-P1, 314-P2, and 314-P3 near a periphery of the semiconductor die 302.

Embodiments include a semiconductor device having a power device and an SBD disposed in a multi-tub semiconductor die, wherein cells of the power device are disposed within tubs or portions of tubs that will have higher operating temperatures than the average operating temperature of the tubs, and wherein SBD cells are disposed within tubs or portions of tubs that will have lower operating temperatures than the average operating temperature of the tubs. In this manner, embodiments improve the operating characteristics of the SBD in the semiconductor device.

For example, SBD cells may be disposed in tubs near edges of the semiconductor die, or when cells of the power device and SBD cells are both in a same tub, the SBD cells may be disposed in a portion or portions of the tub near the edges of the semiconductor die.

Placement of the SBD cells in the tubs may be determined using thermal simulation (such as may be performed using Ansys® Redhawk-SC Electrothermal™ software, for example). Device modeling to determine the cell active area footprints may be performed using Technology Computer-Aided Design (TCAD) software (such as may be available from, for example, Synopsys, Silvaco, Crosslight, or the like).

FIG. 4A illustrates multi-tub semiconductor device 400 including a Vertical MOSFET (VMOSFET) and a Vertical SBD (VSBD) according to an embodiment.

The semiconductor device 400 is similar to the semiconductor device 100B of FIG. 1B in that both dispose cells of the Vertical MOSFET in a first plurality of tubs (collectively, MOSFET tubs 418) and cells of the Vertical SBD in a second plurality of tubs (collectively, SBD tubs 416).

The semiconductor device 400 includes first, second, third, and fourth left SBD tubs 416-A1, 416-A2, 416-A3, and 416-A4 disposed adjacent to a left edge of a semiconductor die 402. The left SBD tubs 416-A1, 416-A2, 416-A3, and 416-A4 are respectively encompassed within trench terminations 416-A1T, 416-A2T, 416-A3T, and 416-A4T, and include respective anode contacts 420-A1, 420-A2, 420-A3, and 420-A4 disposed over a top surface of the semiconductor die 402.

The semiconductor device 400 further includes first, second, third, and fourth right SBD tubs 416-B1, 416-B2, 416-B3, and 416-B4 disposed adjacent to a right edge of the semiconductor die 402. The right SBD tubs 416-B1, 416-B2, 416-B3, and 416-B4 are respectively encompassed within trenches 416-B1T, 416-B2T, 416-B3T, and 416-B4T, and include respective anode contacts 420-B1, 420-B2, 420-B3, and 420-B4 disposed over a top surface of the semiconductor die 402.

The semiconductor device 400 further includes first, second, and third MOSFET tubs 418-1, 418-2, and 418-3 respectively disposed across a width of the semiconductor die 402 and inter-leaved with the left SBD tubs 416-A1, 416-A2, 416-A3, and 416-A4 and the right SBD tubs 416-B1, 416-B2, 416-B3, and 416-B4. The MOSFET tubs 418-1, 418-2, and 418-3 are respectively encompassed within trench terminations 418-1T, 418-2T, and 418-3T. The MOSFET tubs 418-1, 418-2, and 418-3 include respective source contacts 404-1, 404-2, and 404-3 and respective gate contacts 406-1, 406-2, and 406-3 disposed over a top surface of the semiconductor die 402.

The trenches 416-A1T, 416-A2T, 416-A3T, 416-A4T, 416-B1, 416-B2, 416-B3, and 416-B4, 418-1T, 418-2T, and 418-3T may be components of a high-voltage termination of their respective tubs, and in embodiments may be filled with a dielectric.

Drains of the MOSFET cells in the MOSFET tubs 418 and cathodes of the SBD cells in the SBD tubs 416 are commonly connected to a drain contact (not shown) disposed over a bottom side of the semiconductor die 402.

By disposing the left SBD tubs 416-A1, 416-A2, 416-A3, and 416-A4 and the right SBD tubs 416-B1, 416-B2, 416-B3, and 416-B4 adjacent to the left and right edges, respectively, of the semiconductor die 402, an operating temperature rise of the SBD tubs 416 due to heat diffusion from the cells in the MOSFET tubs 418-1, 418-2, and 418-3 may be reduced.

FIG. 4B illustrates a detail of a Vertical MOSFET tub 418 of the semiconductor device of FIG. 4A according to an embodiment. The Vertical MOSFET tub 418 may be any of MOSFET tubs 418-1, 418-2, and 418-3.

The Vertical MOSFET tub 418 may be encompassed within a trench termination 418T.

The Vertical MOSFET tub 418 includes a gate electrode 426 and a source electrode 424. The gate electrode 426 may be electrically connected to a gate contact such as the gate contacts 406 shown in FIG. 4A, and the source electrode 424 may be electrically connected to a source contact such as the source contacts 404 shown in FIG. 4A.

The gate electrode 426 and the source electrode 424 each include a plurality of fingers, and the fingers of the gate electrode 426 are inter-digitated with the fingers of the source electrode 424. Each finger of the gate electrode 426 may correspond to a cell of the MOSFET with the two adjacent fingers of the source electrode 424 operating as source electrodes for that MOSFET cell. Accordingly each MOSFET tub 418 may include a plurality of MOSFET cells.

Figure 4C:
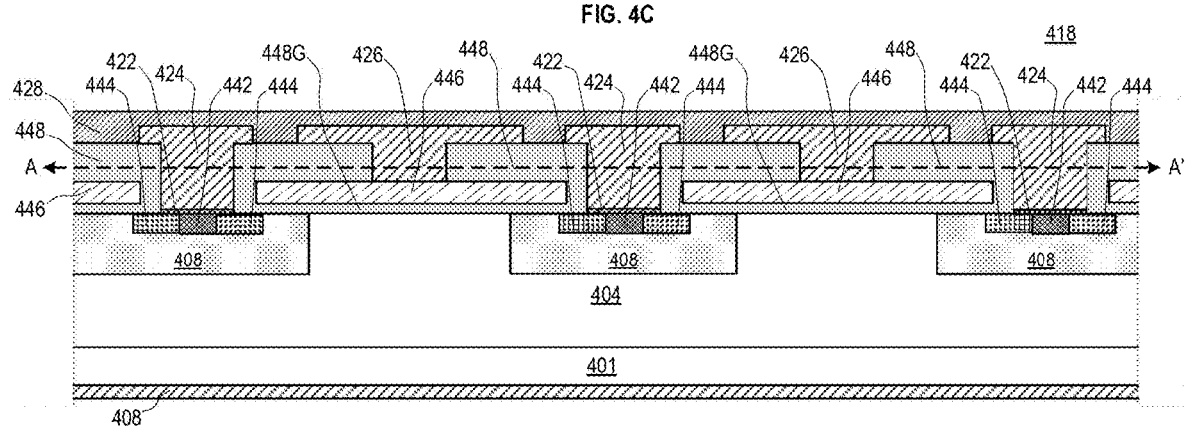
FIG. 4C illustrates a cross-section of a Vertical MOSFET tub of the semiconductor device of FIG. 4A according to an embodiment.

FIG. 4C illustrates a cross-section of a Vertical MOSFET tub 418 of the semiconductor device 400 of FIG. 4A according to an embodiment. The cross-section is taken along the line A-A' of FIGS. 4A and 4B, and it illustrates two of the MOSFET cells disposed within the Vertical MOSFET tub 418.

FIG. 4C shows a semiconductor substrate 401 of the semiconductor device 400 and an epitaxy layer 404 disposed over at top surface the semiconductor substrate 401. In embodiments, the semiconductor substrate 401 and the epitaxy layer 404 comprise 4H—SiC, but embodiments are not limited thereto.

FIG. 4C further shows a drain contact 408 disposed over a bottom surface the semiconductor substrate 401. The drain contact 408 may be electrically connected to all the drains of all the MOSFET cells in all the MOSFET tubs of the semiconductor device 400, and it may also be electrically connected to all the cathodes of all the SBD cells in the SBD tubs of the semiconductor device 400. A silicide layer (not shown) may be disposed between the drain contact 408 and the semiconductor substrate 401 to improve the electrical connection between them; the silicide layer may comprise, for example, nickel silicide, or may be a silicide of another metal capable of forming an ohmic contact with n-type SiC.

P-bodies 408 of p-doped semiconductor are disposed within the epitaxy layer 404. Heavily-doped p-type regions 442 and heavily-doped n-type source regions 444 are disposed within each of the p-bodies 408. Silicide layers 422 are disposed over and electrically connected to the heavily-doped p-type regions 442 and the source regions 444; the heavily-doped p-type regions 442 operate to provide a low contact resistance connection between the silicide layer 422 and the p-bodies 408. The silicide layers 422 may comprise nickel silicide, or may be a silicide of another metal capable of forming an ohmic contact with both p-type and n-type SiC.

A dielectric 448 including gate dielectrics 448G is disposed over the epitaxy layer 404 including over portions of the p-bodies 408 and source regions 444. In an embodiment, the dielectric 448, the gate dielectric 448G, or both may comprise silicon dioxide ($SiO_2$). In an embodiment, the dielectric 448 may comprise BoroPhosphoSilcate Glass (BPSG). In an embodiment, the dielectric 448 may comprise a material with low dielectric permittivity ("low-k" material), such as but not limited to BenzoCycloButene (BCB).

Gate electrodes 446 are disposed over the gate dielectrics 448G and overlapping portions of the p-bodies 408; the portions of the p-bodies 408 overlapped by a gate electrode 446 comprise a channel region of the MOSFET cell corresponding to that gate electrode 446. The gate electrodes may comprise doped polysilicon.

Gate contacts 426 are disposed over and in electrical contact with the gate electrodes 446. Source contacts 424 are formed over and in electrical contact with the silicide layers 422. The gate contacts 426 and the source contacts 424 may each comprise aluminum, among other conductors.

A passivation layer 428 is disposed over the dielectric 448, the gate contacts 426, and the source contacts 424. In an embodiment, the passivation layer 428 may include silicon oxynitride (SiON).

FIG. 4C illustrates a possible structure of VMOSFET cells within a MOSFET tub 418 of an embodiment, but embodiments are not limited thereto.

Figure 4D:
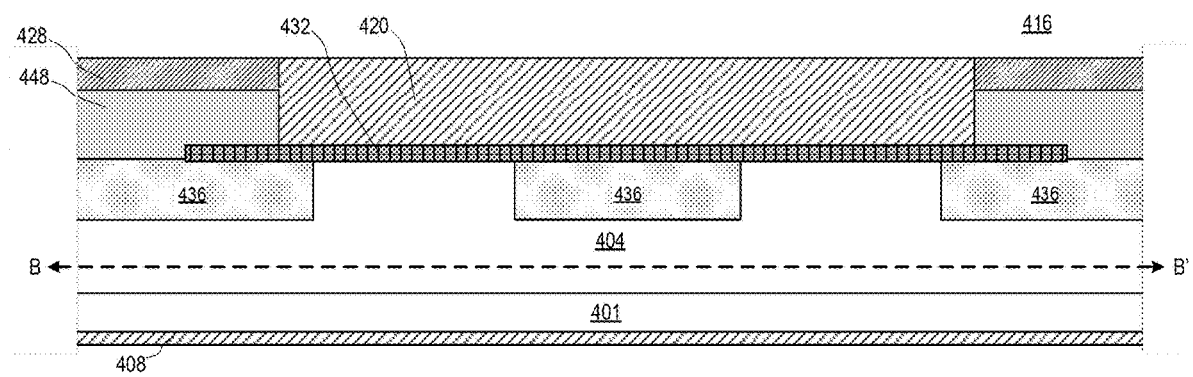
FIG. 4D illustrates a cross-section of a Vertical SBD tub of the semiconductor device of FIG. 4A according to an embodiment.

FIG. 4D illustrates a cross-section of an SBD tub 416 of the semiconductor device 400 of FIG. 4A according to an embodiment. The cross-section is taken along the line B-B' of FIG. 4A and illustrates a Vertical SBD cell disposed within the SBD tub 418.

FIG. 4D shows the semiconductor substrate 401 of the semiconductor device 400 and the epitaxy layer 404 disposed over at top surface the semiconductor substrate 401, as described with respect to FIG. 4C.

FIG. 4D further shows the drain contact 408 disposed over the bottom surface the semiconductor substrate 401, as described with respect to FIG. 4C, which may be electrically connected to all the cathodes of all the SBD cells in the SBD tubs 416 of the semiconductor device 400.

In the SBD tub 416, p-shields 436 are formed within the epitaxy layer 404. A Schottky layer 432 is formed over the over the epitaxy layer 404 and all or portions of the p-shields 436. The Schottky layer 432 comprises a material (typically a metal) having a different work function than the epitaxy layer 404 so that a Schottky barrier arises at the junction of the Schottky layer 432 and the epitaxy layer 404. Here, where the epitaxy layer 404 is an n-type semiconductor, the Schottky layer 432 comprises a material having a higher work function than the epitaxy layer 404. Accordingly, in the illustrated example, the Schottky layer 432 may comprise titanium (Ti), titanium tungsten (TiW), nickel (Ni), molybdenum (Mo), platinum (Pt), chromium (Cr), tantalum (Ta), or the like.

The dielectric 448 is disposed over the portions of the p-shields 436 and over portions of the Schottky layer 432. The passivation layer 428 is disposed over the dielectric 448.

A cathode contact 420 is disposed over and in electrical contact with the Schottky layer 432. The cathode contact 420 may comprise aluminum, among other conductors.

FIG. 4D illustrates a possible structure of a Vertical SBD cell within an SBD tub 416 of an embodiment, but embodiments are not limited thereto.

FIG. 5A illustrates a multi-tub semiconductor device 500A including a Vertical MOSFET and a Vertical SBD according to another embodiment.

The semiconductor device 500A is similar to the semiconductor device 100B of FIG. 1B in that both dispose MOSFET cells in a first plurality of tubs (collectively, MOSFET tubs 518) and SBD cells in a second plurality of tubs (collectively, SBD tubs 516).

The semiconductor device 500A includes upper and lower SBD tubs 516-1 and 516-2 respectively disposed adjacent to upper and lower edges of a semiconductor die 502. The SBD tubs 516-1 and 516-2 are respectively encompassed within trench terminations 516-1T and 516-2T, and include respective anode contacts 520-1 and 520-2 disposed over a top surface of the semiconductor die 502.

The semiconductor device 500A further includes first, second, third, and fourth MOSFET tubs 518-1, 518-2, 518-3, and 518-4 respectively disposed across a width of the semiconductor die 502 and between the upper and lower SBD tubs 516-1 and 516-2. The MOSFET tubs 518-1, 518-2, 518-3, and 518-4 are respectively encompassed within trench termination 518-1T, 518-2T, 518-3T, and 518-4T. The MOSFET tubs 518-1, 518-2, 518-3, and 518-4 include respective source contacts 504-1, 504-2, 504-3, and 504-4 and respective gate contacts 506-1, 506-2, 506-3, and 506-4 disposed over a top surface of the semiconductor die 502.

Drains of the MOSFET cells in the MOSFET tubs 518 and cathodes of the SBD cells in the SBD tubs 516 are commonly connected to a drain contact (not shown) disposed over a bottom side of the semiconductor die 502.

In an embodiment, internal structures of the MOSFET tubs 518 and the SBD tubs 516 may be substantially similar to the structures of the MOSFET tubs 418 and the SBD tubs 416 shown in FIGS. 4C and 4D, respectively.

By disposing the upper and lower SBD tubs 516-1 and 516-2 adjacent to upper and lower edges, respectively, of the semiconductor die 502, an operating temperature rise of the SBD tubs 516-1 and 516-2 due to heat diffusion from the MOSFET tubs 518-1 through 518-4 may be reduced.

FIG. 5B illustrates a multi-tub semiconductor device 500B including a Vertical MOSFET and an SBD according to another embodiment.

The semiconductor device 500B is similar to the semiconductor device 500A of FIG. 5A. However, the semiconductor device 500B is designed for operational conditions wherein the center of the semiconductor die 502B is cooler than the edges of the semiconductor die 502B, such as may be the case when, for example, the semiconductor die 502B is cooled using a fluid that impinges on the semiconductor device 500B at its center.

Accordingly, since operating temperatures at the center of the semiconductor die 502B are lower than operating temperatures at the periphery of the semiconductor die 502B, the upper and lower SBD tubs 516-1 and 516-2 of semiconductor device 500B are located in proximity to the center of the semiconductor die 502B.

FIG. 6 illustrates a multi-tub semiconductor device 600 including a Vertical MOSFET and a Vertical SBD according to another embodiment.

The semiconductor device 600 is similar to the semiconductor device 100B of FIG. 1B in that both dispose MOSFET cells in a first plurality of tubs (collectively, MOSFET tubs 618) and SBD cells in a second plurality of tubs (collectively, SBD tubs 616).

In FIG. 6, the unshaded tubs are MOSFET tubs 618, and the shaded tubs are SBD tubs 616. The MOSFET tubs 618 may be internally configured similarly to the MOSFET tubs 418 of the semiconductor device 400 shown in FIG. 4A, and the SBD tubs 616 may be internally configured similarly to the SBD tubs 416 of the semiconductor device 400 shown in FIG. 4A.

The SBD tubs 616 are disposed in a left end region and a right end region of a semiconductor die 602, and the MOSFET tubs 618 are disposed between the left end region and the right end region.

By disposing the SBD tubs 618 in the left end region and the right end region of the semiconductor die 602, an operating temperature rise of the SBD tubs 616 due to heat diffusion from the MOSFET tubs 616 may be reduced.

FIG. 7 illustrates a multi-tub semiconductor device 700 including a Vertical MOSFET and a Vertical SBD according to another embodiment.

The semiconductor device 700 is similar to the semiconductor device 100C of FIG. 1C in that semiconductor device 700 disposes both MOSFET cells and SBD cells in each of a plurality of mixed tubs (collectively, mixed tubs 714).

The semiconductor device 700 includes first, second, third, fourth, fifth, and sixth mixed tubs 714-1, 714-2, 714-3, 714-4, 714-5, and 714-6 disposed in parallel across a long axis of a semiconductor die 702. Long axes of the mixed tubs 714 are aligned with a short axis of the semiconductor die 702.

The mixed tubs 714 are substantially identical, and accordingly only the first mixed tub 714-1 will be described in the interest of brevity.

Upper and lower SBD portions 710-A1 and 710-B1 of the first mixed tub 714-1 (shown with hatching) comprise SBD cells, and they are respectively disposed in portions of the first mixed tub 714-1 that are adjacent to the upper and lower edges of the semiconductor die 702. MOSFET cells are not present in the SBD portions 710-A1 and 710-B1.

A MOSFET portion 712-1 of the first mixed tub 714-1 (shown unshaded) comprises MOSFET cells, and it is disposed between the upper and lower SBD portions 710-A1 and 710-B1. SBD cells are not present in the MOSFET portion 712-1.

The first mixed tub 714-1 is encompassed by a trench termination 714-1T, and it includes source contact 704-1 and gate contact 706-1 disposed on a top surface of the semiconductor die 702.

Gates of the MOSFET cells of the first mixed tub 714-1 are commonly electrically connected to the gate contact 706-1. Source of the MOSFET cells of the first mixed tub 714-1 and anodes of the SBD cells of the first mixed tub 714-1 are commonly electrically connected to the source contact 704-1.

Drains of the MOSFET cells of the first mixed tub 714-1 and cathodes of the SBD cells of the first mixed tub 714-1 are commonly electrically connected to a drain contact (not shown) disposed over a bottom surface of the semiconductor die 702. Drains of the MOSFET cells of the second through sixth mixed tubs 714-2 through 714-6 and cathodes of the SBD cells of the second through sixth mixed tubs 714-2 through 714-6 may also be commonly electrically connected to the drain contact.

In an embodiment, a cross-section of the MOSFET portion 712-1 along the line A-A' may be substantially similar to the cross-section of the MOSFET tub 418 shown in FIG. 4C. However, embodiments are not limited thereto.

In an embodiment, a cross-section of the upper or lower SBD portions 710-A1 or 710-B1 along the line B-B' may be substantially similar to the cross-section of the SBD tub 416 shown in FIG. 4D. However, embodiments are not limited thereto.

By disposing the upper and lower SBD portions 710-1 and 710-2 of first mixed tub 714-1 adjacent to the upper and lower edges, respectively, of the semiconductor die 702, and by disposing the upper and lower SBD portions of each of the second through sixth mixed tubs 714-2 through 714-6 adjacent to the upper and lower edges, respectively, of the semiconductor die 702, operating temperature rise of the SBD portions of the mixed tubs 714 due to heat diffusion from the MOSFET portions of the mixed tubs 714 may be reduced.

Figure 8B:
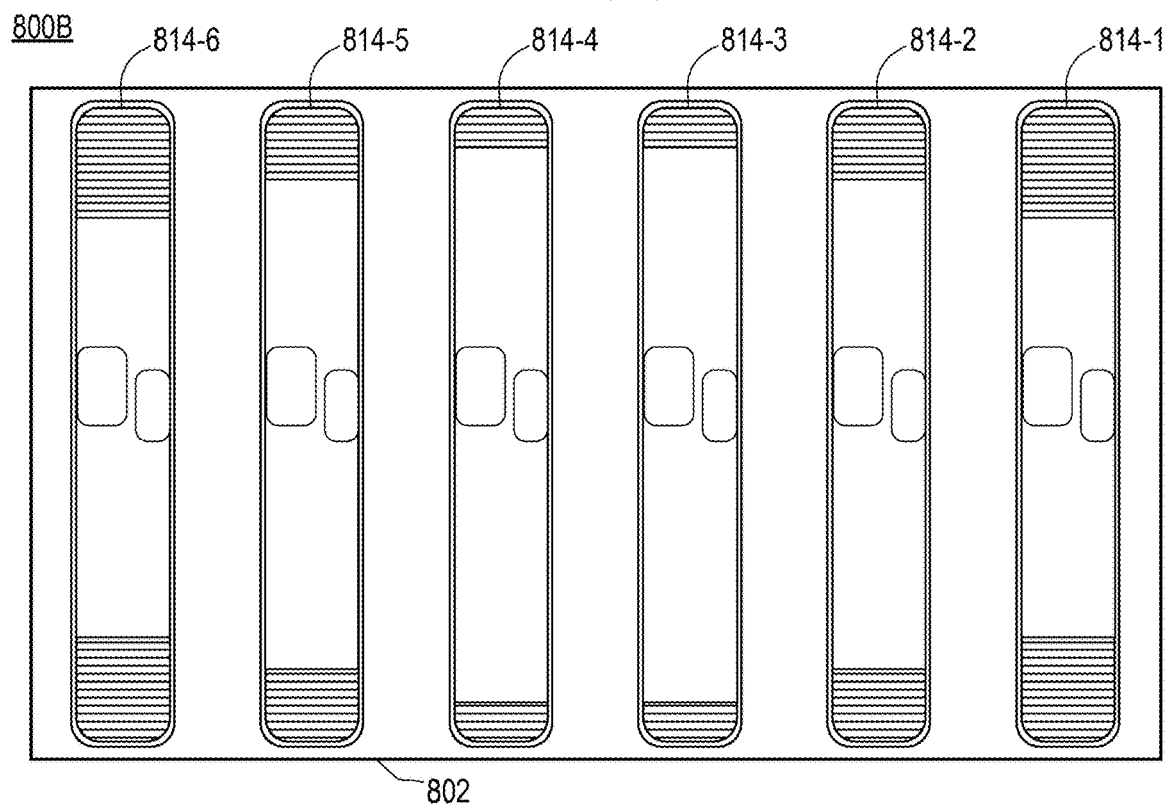
Figure 8C:
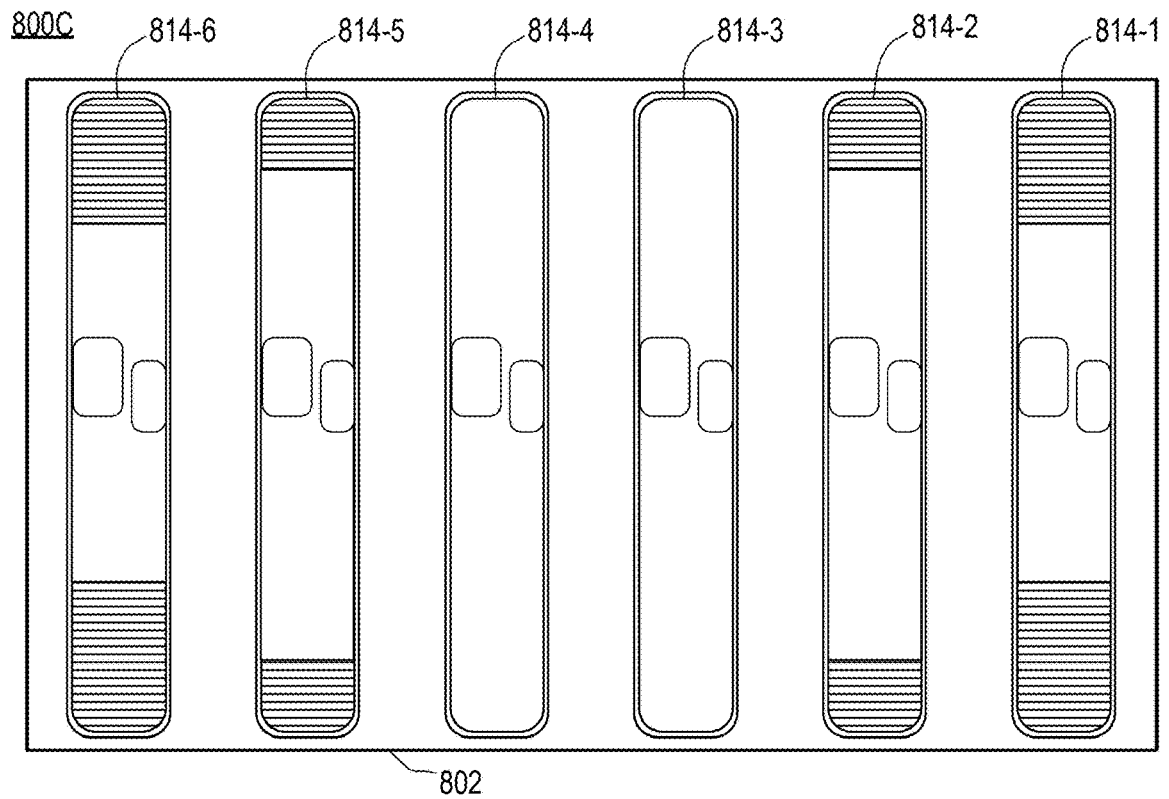

FIGS. 8A, 8B, and 8C illustrates multi-tub semiconductor devices 800A, 800B, and 800C including a Vertical MOSFET and a Vertical SBD according to other embodiments.

FIG. 8A illustrates a multi-tub semiconductor device 800A including a Vertical MOSFET and a Vertical SBD according to another embodiment. The semiconductor device 800A includes first, second, third, fourth, fifth, and sixth mixed tubs 814-1, 814-2, 814-3, 814-4, 814-5, and 814-6.

The semiconductor devices 800A, 800B, and 800C are each similar to the semiconductor device 700 of FIG. 7. For example, like the first mixed tub 714-1 of the semiconductor device 700, the first mixed tub 814-1 of the semiconductor device 800A is encompassed by a trench termination 814-1T, includes a source contact 804-1 and a gate contact 806-1, has upper and lower SBD portions 810-A1 and 810-B1, and has a MOSFET portion 812-1, and descriptions of each are similar to the descriptions of the corresponding structures in FIG. 7. Accordingly, in the interest of brevity, only the differences between the semiconductor devices 800A, 800B, and 800C and the semiconductor device 700 will be described.

In the semiconductor device 700, the areas of the SBD portions (shown with hatching) are the same in each of the mixed tubs 714. In contrast, the areas of the SBD portions of the mixed tubs 814 of the semiconductor devices 800A, 800B, and 800C vary according to expected operating temperatures of the location on the die of the respective mixed tub 814.

For example, while the regions near the upper and lower edges of the semiconductor die 802 may have operational temperatures lower than the operational temperatures of more central regions, the regions in the corners of the semiconductor die 802 may have even lower temperatures. Accordingly, in the semiconductor device 800A, the areas of the SBD portions (shown with hatching) in the first mixed tub 814-1, where the SBD portions are in a corner, are greater than the areas of the SBD portions in the second mixed tub 814-2, which is not in a corner.

The portions of each mixed tub 814 used as SBD portions may be determined so as to minimize an average operating temperature or a highest operating temperature in the SBD portions. For example, a temperature map such as shown in FIG. 3C may be determined, and the SBD portions of the mixed tubs 814 disposed using a contour line (that is, an isotherm) of the temperature map as an innermost boundary for SBD portions.

The isotherm used as the boundary may be determined according to the total area needed for the SBD portions. Because the total area needed for the SBD portions may depend on the operating temperatures of the SBD, an iterative process of repeated design, simulation, and evaluation may be used to determine the isotherm.

Accordingly, in some embodiments such as the semiconductor device 800A of FIG. 8A, the SBD portions in the outermost mixed tubs 814 (such as first upper and first lower SBD portions 810-A1 and 810-B1 of first mixed tub 814-1) may have a first area, and the SBD portions in the more central mixed tubs 814 (such as such as second upper and second lower SBD portions 810-A2 and 810-B2 of second mixed tub 814-2) may have a second area smaller than the first area.

In other embodiments, such as the semiconductor devices 800B of FIG. 8B, the areas of each of the SBD portions of each mixed tub 814 may differ according to the operating temperatures in each mixed tub 814.

In some embodiments, such as the semiconductor devices 800C of FIG. 8C, some mixed tubs 814, such as the center-most of the mixed tubs 814-3 and 814-4, may not have SBD portions, but may instead include only a MOSFET portion (and thus may not actually be mixed tubs).

Because an average operating temperature or a highest operating temperature of the SBD portions of the semiconductor devices 800A, 800B, or 800C may be lower than the corresponding operating temperature of the semiconductor devices 700, a total area used for SBD portions may be lower in the semiconductor devices 800A, 800B, or 800C.

Compared to the semiconductor devices 400, 500A, and 600 of FIGS. 4, 5A, and 6, the semiconductor devices 700, 800A, 800B, and 800C of FIGS. 7, 8A, 8B, and 8C eliminate the need to use bond wires to connect the anodes of the SBD cells to the sources of the MOSFETs, since in the semiconductor devices 700, 800A, 800B, and 800C such connections may be formed within the wiring layers of the mixed tubs. Furthermore, the parasitic capacitances of the high-voltage terminations in the semiconductor devices 700, 800A, 800B, and 800C may be lower than the parasitic capacitances of the high-voltage terminations in the semiconductor devices 400, 500A, and 600.

FIG. 9 illustrates a multi-tub semiconductor device 900 including a Vertical MOSFET and a Vertical SBD according to another embodiment.

The semiconductor device 900 is similar to the semiconductor device 100C of FIG. 1C in that semiconductor device 900 disposes both MOSFET cells and SBD cells in each of a plurality of mixed tubs (collectively, mixed tubs 914).

The semiconductor device 900 is similar to the semiconductor device 700 of FIG. 7. For example, like the first mixed tub 714-1 of the semiconductor device 700, the first mixed tub 914-1 of the semiconductor device 900 is encompassed by a trench termination 914-1T, includes a source contact 904-1 and a gate contact 906-1, and has a MOSFET portion 912-1 that includes MOSFET cells but not SBD cells. Descriptions of each of these structures are similar to the descriptions of the corresponding structures in FIG. 7. Accordingly, in the interest of brevity, only the differences between the semiconductor devices 900 and the semiconductor device 700 will be described.

The first, second, third, fourth, fifth, and sixth mixed tubs 914-1, 914-2, 914-3, 914-4, 914-5, and 914-6 are substantially identical, and accordingly only the first mixed tub 914-1 will be described in the interest of brevity.

Instead of the upper and lower SBD portions (such as first upper and first lower SBD portions 710-A1 and 710-B1 of first mixed tub 714-1) of the semiconductor device 700 of FIG. 7 that include SBD cells but not MOSFET cells, the mixed tubs 914 of the semiconductor device 900 have upper and lower portions that include both MOSFET and SBD cells (hereinafter, mixed portions, shown cross-hatched) such as first upper and first lower mixed portions 911-A1 and 911-B1 of first mixed tub 914-1.

The upper and lower mixed portions 911-A1 and 911-B1 of the first mixed tub 914-1 comprise both SBD cells and MOSFET cells. The upper and lower mixed portions 911-A1 and 911-B1 of the first mixed tub 914-1 are respectively disposed in portions of the first mixed tub 914-1 that are adjacent to the upper and lower edges of the semiconductor die 902.

A MOSFET portion 912-1 of the first mixed tub 914-1 (shown unshaded) comprise MOSFET cells and does not include SBD cells. The MOSFET portion 912-1 is disposed between the upper and lower mixed portions 911-A1 and 911-B1.

Gates of the MOSFET cells in both the MOSFET portion 912-1 and the mixed portions 911-A1 and 911-B1 of the first mixed tub 914-1 are electrically connected to the gate contact 906-1. Source of the MOSFET cells in both the MOSFET portion 912-1 and the mixed portions 911-A1 and 911-B1 of the first mixed tub 914-1 and anodes of the SBD cells in the mixed portions 911-A1 and 911-B1 of the first mixed tub 914-1 are electrically connected to the source contact 904-1.

Drains of the MOSFET cells in both the MOSFET portion 912-1 and the mixed portions 911-A1 and 911-f1 of the first mixed tub 914-1 and cathodes of the SBD cells in the mixed portions 911-A1 and 911-B1 of the first mixed tub 914-1 are electrically connected to a drain contact (not shown) disposed over a bottom surface of the semiconductor die 902. Drains of the MOSFET cells in both the MOSFET portions and the mixed portions of the second through sixth mixed tubs 914-2 through 914-6 and cathodes of the SBD cells in the mixed portions of the second through sixth mixed tubs 914-2 through 914-6 may also be electrically connected to the drain contact.

In an embodiment, a cross-section of the MOSFET portion 912-1 along the line A-A' may correspond to the cross-section of the MOSFET tub 418 shown in FIG. 4C. However, embodiments are not limited thereto.

Figure 11A:
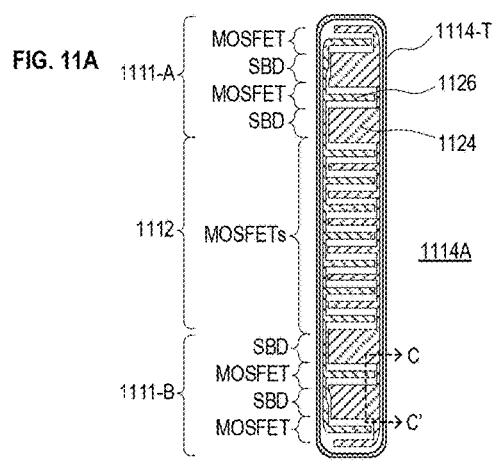
FIG. 11A illustrates details of a tub of a semiconductor device according to an embodiment.

In an embodiment, a cross-section of the upper or lower mixed portions 911-A1 or 911-f1 such as along the line C-C' may correspond to the cross-section shown in FIG. 11A. In another embodiment, a cross-section of the upper or lower mixed portions 911-A1 or 911-f1 such as along the line C-C' may correspond to the cross-section shown in FIG. 11B. However, embodiments are not limited thereto.

In embodiments, the MOSFET cells and SBD cells in the mixed portions of the mixed tubs 914 are interleaved, such as will be discussed with reference to FIG. 11A and 11B below.

By disposing the mixed portions of the mixed tubs 914 at cooler locations of the semiconductor die 902, some of the temperature-related advantages obtained in the semiconductor device 700 may also be obtained. However, because heat-generating MOSFET cells are disposed near the SBD cells, the temperature-related advantages will not be as large.

However, because the mixing of the SBD cells and MOSFET cells in the mixed portions of the mixed tubs 914 permits the SBD cells to be separated from each other without increasing the total active area of the device (since MOSFET cells occupy the space between the SBD cells), the SBD may benefit from current spreading in the epitaxy layer under the MOSFET cells, as will be explained with reference to FIGS. 12 and 13 below.

FIG. 10 illustrates a multi-tub semiconductor device 1000 including a Vertical MOSFET and a Vertical SBD according to another embodiment. The semiconductor device 1000 includes first, second, third, fourth, fifth, and sixth mixed tubs 1014-1, 1014-2, 1014-3, 1014-4, 1014-5, and 1014-6.

The semiconductor device 1000 is similar to the semiconductor device 900 of FIG. 9. For example, like the first mixed tub 914-1 of the semiconductor device 900, the first mixed tub 1014-1 of the semiconductor device 1000 is encompassed by a trench termination 1014-1T, includes a source contact 1004-1 and a gate contact 1006-1, has upper and lower mixed portions 1011-A1 and 1011-B1, and has a MOSFET portion 1012-1, and descriptions of each are similar to the descriptions of the corresponding structures in FIG. 9. Accordingly, in the interest of brevity, only the differences between the semiconductor device 1000 and the semiconductor device 900 will be described.

In the semiconductor device 900, the areas of the mixed portions (shown with cross-hatching) are the same in each of the mixed tubs 914. In contrast, the areas of the mixed portions of the mixed tubs 1014 of the semiconductor device 1000 vary according to expected operating temperatures of the location on the die of the respective mixed tub 1014.

For example, while the regions near the upper and lower edges of the semiconductor die 1002 may have operational temperatures lower than the operational temperatures of more central regions, the regions in the corners of the semiconductor die 1002 may have even lower operational temperatures. Accordingly, in the semiconductor device 1000, the areas of the mixed portions 1011-A1 and 1011-B1 (shown with cross-hatching) in the first mixed tub 1014-1, where the mixed portions are in a corner, are greater than the areas of the mixed portions mixed portions 1011-A2 and 1011-B2 in the second mixed tub 1014-2, which is not in a corner.

The portions of each mixed tub 1014 used as mixed portions may be determined so as to minimize an average operating temperature or the highest operating temperature in the mixed portions. For example, a temperature map such as shown in FIG. 3C may be determined, and the mixed portions of the mixed tubs 1014 disposed using a contour line (that is, an isotherm) of the temperature map as an innermost boundary for mixed portions.

The isotherm used as the boundary may be determined according to the total area needed for the mixed portions. Because the total area needed for the mixed portions may depend on the operating temperatures of the SBD cells in the mixed portions, an iterative process of repeated design, simulation, and evaluation may be used to determine the isotherm.

Accordingly, in some embodiments such as the semiconductor device 1000, the mixed portions in the outermost mixed tubs 1014 (such as first upper and first lower mixed portions 1011-A1 and 1011-B1 of first mixed tub 1014-1) may have a first area, and the mixed portions in the more central mixed tubs 1014 (such as such as second upper and second lower mixed portions 1011-A2 and 1011-B2 of second mixed tub 1014-2) may have a second area smaller than the first area.

In other embodiments, the areas of each of the mixed portions of each mixed tub 1014 may differ according to the operating temperatures in each mixed tub 1014.

In some embodiments, some mixed tubs 1014, such as one or more center-most tubs on the die 1002, may not have mixed portions, but may instead include only a MOSFET portion.

Because an average operating temperature or a highest operating temperature of the SBD cells in the mixed portions of the semiconductor devices 1000 may be lower than the corresponding operating temperature of the semiconductor devices 900, a total area used for SBD cells in the mixed portions may be lower in the semiconductor devices 1000.

FIG. 11A is a plan view illustrating details of a mixed tub 1114A according to an embodiment. The mixed tub 1114A may be any of mixed tubs 914-1 through 914-6 of FIG. 9 or mixed tubs 1014-1 through 1014-6 of FIG. 10.

The mixed tub 1114A includes a gate electrode 1126 and a source electrode 1124. The gate electrode 1126 may be electrically connected to a gate contact such as gate contacts 906-1 shown in FIG. 9, and the source electrode 1124 may be electrically connected to a source contact such as the source contact 904-1 shown in FIG. 9.

The gate electrode 1126 and the source electrode 1124 each include a plurality of fingers, and the fingers of the gate electrode 1126 are interdigitated with the fingers of the source electrode 1124.

In a MOSFET region 1112 of the mixed tub 1114A, each finger of the gate electrode 1126 may correspond to a MOSFET cell, with the two adjacent fingers of the source electrode 1124 operating as source electrodes for that MOSFET cell.

In upper and lower mixed portions 1111-A and 1111-B of the mixed tub 1114A, each finger of the gate electrode 1126 may correspond to a cell of the MOSFET, and each finger of the source electrode 1124 may correspond to an anode of an SBD cell and may also operate as source electrodes for the adjacent MOSFET cells.

Accordingly, the mixed tub 1114A may include a plurality of MOSFET cells and a plurality of SBD cells, with the MOSFET cells disposed throughout the mixed tub 1114A and the SBD cells disposed only in the mixed portions 1111-A and 1111-B of the mixed tub 1114A.

While FIG. 11A illustrates the mixed tub 1114A with four SBD cells and eleven MOSFET cells, embodiments are not limited thereto, and may include more or fewer of each cell type.

Also, while FIG. 11A illustrates the uppermost and lowermost cells of the mixed tub 1114A as being MOSFET cells, embodiments are not limited thereto, and in embodiments the uppermost and lower most cells of the mixed tub 1114A may be SBD cells.

Also, while FIG. 11A illustrates alternation of MOSFET cells and SBD cells in the mixed portions 1111-A and 1111-B of the mixed tub 1114A, with one SBD cell between each adjacent pair of MOSFET cells and one MOSFET cell between each adjacent pair of SBD cells, embodiments are not limited thereto, and in embodiments the mixed portions 1111-A and 1111-B of the mixed tub 1114A may include more than one SBD cell between each adjacent pair of MOSFET cells, more than one MOSFET cell between each adjacent pair of SBD cells, or both.

Figure 11B:
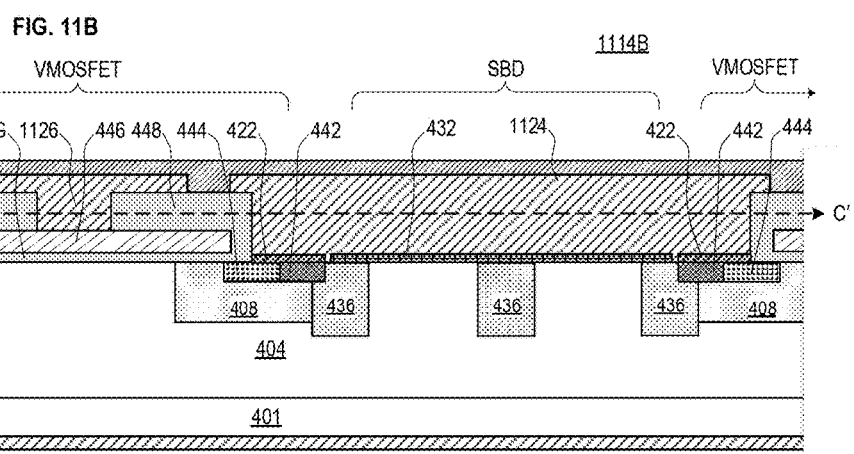
FIG. 11B illustrates a cross-section of a tub of a semiconductor device according to an embodiment.

FIG. 11B illustrates a cross-section of a mixed tub 1114B according to an embodiment. The cross-section may be taken along the line C-C' of FIG. 9, 10, or 11A and illustrates inter-digitated MOSFET and SBD cells disposed within the mixed portions of mixed tub 1114B.

Features having reference characters of the form 4xx in FIG. 11B are substantially similar to features having the same reference characters in FIGS. 4C and 4D, and descriptions thereof are therefore omitted in the interest of brevity. Features having reference characters of the form 11xx in FIG. 11B are substantially similar to features having the same reference characters in FIG. 11A, and descriptions thereof are therefore omitted in the interest of brevity.

FIG. 11B shows how each finger of the source electrode 1124 operates both as an anode for the corresponding SBD cell and as source electrodes for the adjacent MOSFET cells.

Figure 11C:
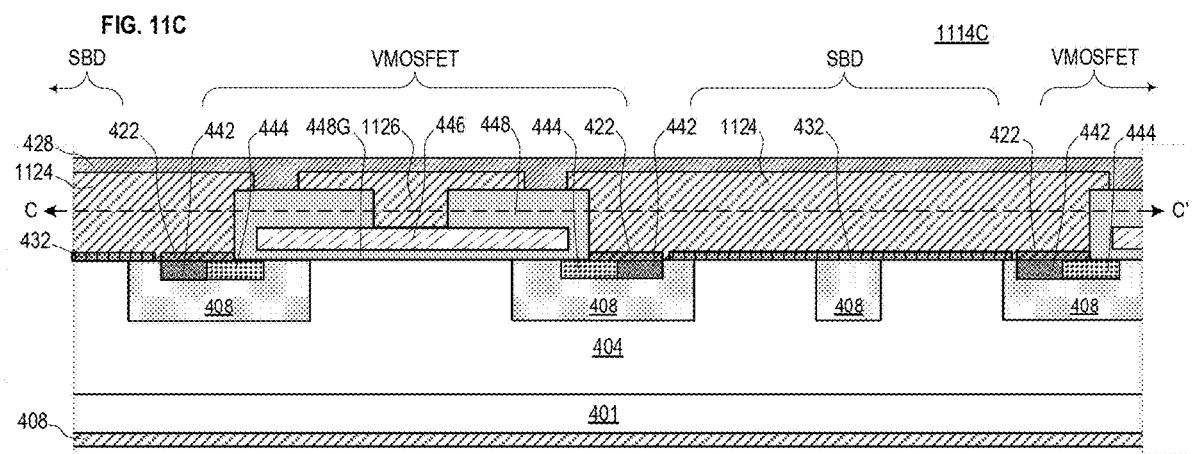
FIG. 11C illustrates a cross-section of a tub of a semiconductor device according to another embodiment.

FIG. 11C illustrates a cross-section of a mixed tub 1114C according to an embodiment. The cross-section may be taken along the line C-C' of FIG. 9, 10, or 11A and illustrates inter-digitated MOSFET and SBD cells disposed within the mixed portions of mixed tub 1114C.

As the mixed tub 1114C is mostly similar in structure to the mixed tub 1114B of FIG. 11B, only differences between the two will be described in the interest of brevity.

In the mixed tub 1114C, there are no p-shields 436 as there are in mixed tub 1114B of FIG. 11B. Instead, p-bodies 408 perform the functions in the mixed tub 1114C that the p-shields 436 performed in mixed tub 1114B. Accordingly, a number of p-bodies 408 may be increased relative to the mixed tub 1114B, and the shapes of the p-bodies 408 may be altered.

Figure 12:
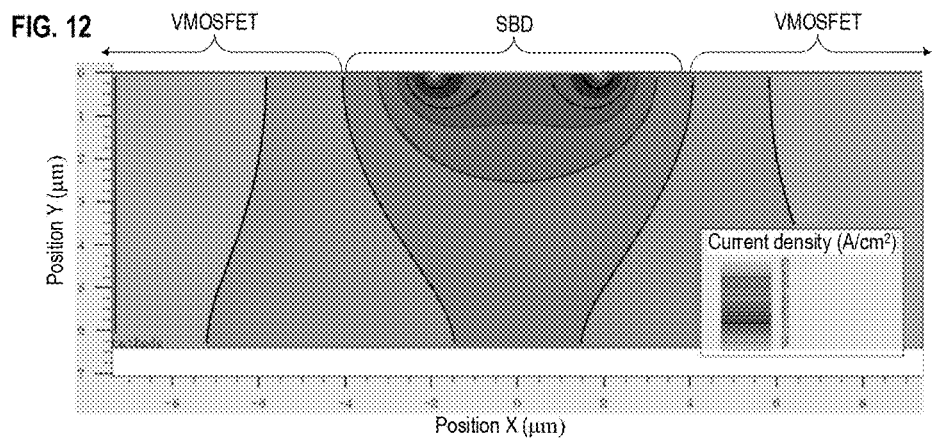
FIG. 12 illustrates current spreading of an SBD cell of the semiconductor device of FIG. 10 or 11 according to an embodiment.

FIG. 12 illustrates the current spreading in the epitaxy layer for an SBD cell of the semiconductor device of FIG. 9 or 10 according to an embodiment. Because the MOSFET cells adjacent to the SBD cell do not conduct current when the SBD cell does, the current through the SBD cell can spread into the epitaxy layer disposed below, reducing the series resistance of the SBD cell.

FIG. 13 illustrates an effect of the current spreading for an SBD cell of the semiconductor device of FIG. 9 or 10 according to an embodiment. The graph represents the specific series resistance ($R_{S,SP}$) of the SBD as a function of the width of the MOSFET/SBD cell (noted as $W_{UNDERLAP}$). Two curves are reported for different widths (1.0 and 3.8 μm) of the SBD portion of the MOSFET/SBD cell (noted as $W_{ACTIVE}$).

The decrease of the specific series resistance as $W_{UNDERLAP}$ increases is due to the spreading of the SBD current under the MOSFET portion of MOSFET/SBD cell. This decrease is stronger for a narrower SBD portion of the MOSFET/SBD, corresponding to a smaller $W_{ACTIVE}$. For the same $V_F$ target at a given $I_F$, an SBD with a smaller active area can be designed by leveraging the current spreading in the epitaxy layer. Based on the specific series resistance reductions reported in FIG. 13, the total active area of an SBD can be reduced by at least a factor two for $W_{ACTIVE}$ equal to 3.8 μm and at least a factor five for $W_{ACTIVE}$ equal to 1.0 μm.

Illustrative embodiments have been provided wherein a semiconductor device including a power device comprised of a plurality of power device cells and a diode comprised of a plurality of diode cell disposes the power device cells and the diode cells in a plurality of tubs in such a manner that operating temperatures of the diode cells are minimized. In embodiments, the semiconductor device is a silicon carbide device, but embodiments are not limited thereto. In embodiments, the power device is a MOSFET, such as a Vertical MOSFET, but embodiments are not limited thereto. In embodiments, the diode is an SBD, such as a Vertical SBD, but embodiments are not limited thereto.

Aspects of the present disclosure have been described in conjunction with the specific embodiments that are presented as illustrative examples. Numerous alternatives, modifications, and variations to the disclosed embodiments may be made without departing from the scope of the claims set forth below. Embodiments disclosed herein are not intended to be limiting.

What is claimed is:

1. A semiconductor device comprising:
 a semiconductor die having a first region and a second region, an operating temperature of the second region being lower than an operating temperature of the first region;
 a plurality of first tubs disposed in the first region;
 a plurality of second tubs disposed in the second region;
 a power device comprising a plurality of power device cells, the power device cells being respectively disposed in the plurality of first tubs; and
 a diode having a plurality of diode cells, the plurality of diode cells being respectively disposed in the plurality of second tubs.

2. The semiconductor device of claim 1,
 wherein the first region includes a central region of the semiconductor die, and
 A wherein the second region includes a peripheral region of the semiconductor die.

3. The semiconductor device of claim 1, wherein the semiconductor device comprises silicon carbide.

4. The semiconductor device of claim 1, wherein the power device comprises a vertical metal oxide semiconductor field effect transistor (MOSFET).

5. The semiconductor device of claim 1, wherein the diode comprises a vertical Schottky barrier diode (SBD).

6. The semiconductor device of claim 1, wherein the second region comprises:
 a first subregion disposed adjacent to a first edge of the semiconductor die and having at least a first tub of the plurality of second tubs disposed therein; and
 a second subregion disposed adjacent to a second edge of the semiconductor die and having at least a second tub of the plurality of second tubs disposed therein, the second edge being an opposite edge of the first edge.

7. The semiconductor device of claim 6, wherein the first region is disposed between the first subregion of the second region and the second subregion of the second region.

8. A semiconductor device comprising:
 a semiconductor die consisting of a first region and a second region, an operating temperature of the second region being lower than an operating temperature of the first region;
 a first tub disposed in both the first region and the second region, the first tub including:
  a first power device cell of a power device disposed in the first region, and
  a first plurality of diode cells of a diode,
  wherein all the diode cells of the first tub are disposed within the second region.

9. The semiconductor device of claim 8, wherein the first tub further includes:
 a second power device cell of the power device disposed in the second region.

10. The semiconductor device of claim 9, wherein the first tub further includes:
 a third power device cell of the power device disposed in the second region,
 wherein the power device cells disposed in the second region are inter-leaved with diode cells disposed in the second region.

11. The semiconductor device of claim 8, wherein the semiconductor device comprises silicon carbide.

12. The semiconductor device of claim 8, wherein the power device comprises a vertical metal oxide semiconductor field effect transistor (MOSFET).

13. The semiconductor device of claim 8, wherein the diode comprises a vertical Schottky barrier diode (SBD).

14. The semiconductor device of claim 8,
 wherein the second region comprises:
  a first subregion disposed adjacent to a first edge of the semiconductor die; and
  a second subregion disposed adjacent to a second edge of the semiconductor die, the second edge being an opposite edge of the first edge, and
 wherein the first region is disposed between the first subregion of the second region and the second subregion of the second region.

15. The semiconductor device of claim 8, further comprising:
 a second tub disposed in both the first region and the second region, the first tub including:

a second power device cell of the power device disposed in the first region, and
a second plurality of diode cells of the diode,
wherein all the diode cells of the second tub are disposed within the second region, and
wherein an area of the second tub disposed in the second region is different from an area of the first tub disposed in the second region.

* * * * *